United States Patent
Nakajima

(10) Patent No.: US 10,171,094 B2
(45) Date of Patent: *Jan. 1, 2019

(54) HIGH ACCURACY CLOCK SYNCHRONIZATION CIRCUIT

(71) Applicant: SEIKO EPSON CORPORATION, Tokyo (JP)

(72) Inventor: Katsuhito Nakajima, Minowa-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/492,573

(22) Filed: Apr. 20, 2017

(65) Prior Publication Data
US 2017/0310330 A1    Oct. 26, 2017

(30) Foreign Application Priority Data

Apr. 25, 2016    (JP) .................................. 2016-086658

(51) Int. Cl.
*H03L 7/095* (2006.01)
*H03L 7/099* (2006.01)
*H03L 7/181* (2006.01)

(52) U.S. Cl.
CPC .............. *H03L 7/095* (2013.01); *H03L 7/099* (2013.01); *H03L 7/181* (2013.01)

(58) Field of Classification Search
CPC . H03L 7/08; H03L 7/085; H03L 7/095; H03L 7/099; H03L 7/18; H03L 7/181
USPC ................. 327/147, 150, 156, 159
See application file for complete search history.

(56) References Cited

U.S. PATENT DOCUMENTS

| 4,305,045 A * | 12/1981 | Metz .......................... H03L 7/07 331/1 A |
| 5,576,664 A * | 11/1996 | Herold .................... H03L 7/091 331/1 A |
| 7,424,069 B1 * | 9/2008 | Nicholls .................... H03L 7/14 375/339 |
| 2009/0267664 A1 | 10/2009 | Uozumi et al. |
| 2017/0194907 A1 * | 7/2017 | Yonezawa ................ H03B 5/04 |
| 2017/0194966 A1 * | 7/2017 | Yonezawa ............... H03L 1/025 |
| 2017/0194967 A1 * | 7/2017 | Yonezawa ............... H03L 1/026 |

(Continued)

FOREIGN PATENT DOCUMENTS

| JP | H08-056153 A | 2/1996 |
| JP | 2009-268047 A | 11/2009 |
| JP | 2015115933 A | 6/2015 |

*Primary Examiner* — William Hernandez
(74) *Attorney, Agent, or Firm* — Oliff PLC

(57) ABSTRACT

A circuit device includes a phase comparator that performs phase comparison between an input signal based on an oscillation signal and a reference signal, a processor that performs a signal process on frequency control data based on a result of the phase comparison, and an oscillation signal generation circuit that generates the oscillation signal having an oscillation frequency which is set on the basis of frequency control data having undergone the signal process. The phase comparator includes a counter that performs a count operation by using the input signal, and performs the phase comparison by comparing a count value in the counter inn (where n is an integer of 2 or more) cycles of the reference signal with an expected value of the count value in integers.

18 Claims, 18 Drawing Sheets

(56) References Cited

U.S. PATENT DOCUMENTS

2017/0194968 A1* 7/2017 Yonezawa ............... H03L 1/026
2017/0307762 A1* 10/2017 Nakajima ............. G01S 19/235
2017/0310326 A1* 10/2017 Nakajima ................ H03B 5/32
2018/0091156 A1* 3/2018 Maki ..................... G04F 10/005

* cited by examiner

HIGH ACCURACY CLOCK SYNCHRONIZATION CIRCUIT

CROSS REFERENCE TO RELATED APPLICATIONS

The current application claims priority to Japanese Patent application 2016-086658 filed Apr. 25, 2016, the entire contents of which are incorporated herein by reference in their entirety.

BACKGROUND

1. Technical Field

The present invention relates to a circuit device, an oscillator, an electronic apparatus, and a vehicle.

2. Related Art

In the related art, there is an oscillator such as an oven controlled crystal oscillator (OCXO) or a temperature compensated crystal oscillator (TCXO). For example, in a base station, a network router, a measurement apparatus, and the like using such an oscillator as a reference signal source, a phase locked loop (PLL) circuit including the oscillator is configured, and an oscillation signal of the oscillator is synchronized with a reference signal such as a GPS signal.

For example, JP-A-08-056153 discloses an oscillation circuit including a GPS receiver which outputs a reference pulse; a voltage controlled oscillator which outputs a clock signal; a counter which counts the number of clocks of the clock signal in one cycle of a reference signal; a difference calculation circuit which calculates an error between a count value and an expected value; and a control voltage generation circuit (an averaging circuit, a conversion circuit, and a D/A conversion circuit) which generates a control voltage for the voltage controlled oscillator for reducing the error.

There is the need for high accuracy of an oscillation frequency of an oscillation signal in an oscillator such as an OCXO or a TCXO. In other words, in a PLL circuit which synchronizes an oscillation signal with a reference signal, there is the need for reducing a phase error between a reference signal and an oscillation signal in a lock state. On the other hand, a circuit device controlling an oscillator is preferably miniaturized.

SUMMARY

An advantage of some aspects of the invention is to provide a circuit device, an oscillator, an electronic apparatus, and a vehicle capable of reducing a phase error in a lock state of a PLL circuit and miniaturizing the circuit device.

The invention can be implemented as the following forms or embodiments.

An aspect of the invention relates to a circuit device including a phase comparator that performs phase comparison between an input signal based on an oscillation signal and a reference signal; a processor that performs a signal process on frequency control data based on a result of the phase comparison; and an oscillation signal generation circuit that generates the oscillation signal having an oscillation frequency which is set on the basis of frequency control data having undergone the signal process from the processor, in which the phase comparator includes a counter that performs a count operation by using the input signal, and performs the phase comparison by comparing a count value in the counter in n (where n is an integer which can be set to 2 or more) cycles of the reference signal with an expected value of the count value in integers.

According to the aspect of the invention, the phase comparator performs phase comparison of comparing a count value in the counter with an expected value in integers, and thus the phase comparator can be formed with a simple configuration. Consequently, it is possible to miniaturize the circuit device. According to the aspect of the invention, the phase comparator compares a count value in the counter in n cycles of the reference signal with the expected value of the count value in integers. In addition, n can be set to 2 or more. Consequently, the time resolution of a phase error detected by the phase comparator can be reduced. In other words, it is possible to reduce a phase error in a lock state of a PLL circuit including the phase comparator.

In the aspect of the invention, n may be set to k1 (where k1 is an integer of 2 or more) in at least a lock state of a PLL circuit including the phase comparator.

As mentioned above, since n is set to an integer of 2 or more in a lock state, the time resolution of a phase error in the lock state can be reduced, and thus an oscillation signal which is synchronized with the reference signal with high accuracy can be generated.

In the aspect of the invention, n may be set to k2 (where k2 is an integer of 1 or more and below k1) at the time of starting of the PLL circuit.

As mentioned above, since n=k2 less than n=k1 in a lock state is set at the time of starting of the PLL circuit, a cycle for phase comparison is reduced more than in the lock state, and thus the time until the lock state occurs from starting of a synchronization operation can be reduced.

In the aspect of the invention, n may be set to k3 (where k3 is an integer of 1 or more and below k1) in a test mode.

As mentioned above, since n=k3 less than n=k1 in a lock state is set in the test mode, the time until the lock state occurs from starting of a synchronization operation can be reduced. Consequently, it is possible to reduce the time required to test the circuit device or an electronic apparatus into which the circuit device is incorporated.

In the aspect of the invention, n may be set to be variable.

If n is set to be variable, n can be set to a great integer of 2 or more in order to obtain a highly accurate oscillation frequency in a lock state. On the other hand, n can be set to an integer smaller than that in the lock state in order to reduce the pull-in time in a pull-in state during starting or the test mode.

In the aspect of the invention, in a case where n may be set to k4 (where k4 is an integer of 1 or more), the phase comparator sets n to k5 (where k5 is an integer of 2 or more) more than k4 if a difference between the count value and the expected value is equal to or less than a predetermined value.

With this configuration, in a case where a phase error is equal to or less than a predetermined value, n is set to a greater integer. Consequently, in a case where a lock state (or a state similar thereto) occurs with respect to an initially set value of n, a greater value of n is set next, and in a case where a lock state occurs with respect to the set value of n, a further greater value of n is set next. A lock state in a final value of n can be reached while repeating this operation.

In the aspect of the invention, a gain adjustment coefficient for a result of the phase comparison may be set depending on a value of n.

According to the aspect of the invention, in a case where n is set to be variable, a gain adjustment coefficient is set depending on a value of n. Consequently, a coefficient which depends on a value of n multiplied by a phase comparison result can be set to an appropriate coefficient corresponding to the value of n, and calculation on the phase comparison result can be performed.

In the aspect of the invention, the phase comparator may shift bits of frequency setting data according to a value of n so as to obtain the expected value, and perform comparison between the obtained expected value with the count value as the phase comparison.

With this configuration, since bits of the frequency setting data are shifted depending on a value of n, the value of n is multiplied by the frequency setting data, and thus the expected value of the count value can be obtained. If the expected value is compared with the count value, it is possible to perform phase comparison inn cycles of the reference signal.

In the aspect of the invention, the counter may count down by using the input signal in n cycles of the reference signal with the expected value obtained through bit shifting as an initial value, and output the count value obtained through the countdown as a result of the phase comparison.

With this configuration, the expected value obtained through bit shifting is set as an initial value of a count value. Countdown is performed from the initial value, and thus a count value after n cycles of the reference signal elapses can be obtained as a phase comparison result.

In the aspect of the invention, the processor may perform the signal process including at least one of a temperature compensation process, an aging correction process, and a process of correcting capacitance characteristics of a variable capacitance capacitor connected to a resonator used to generate the oscillation signal, and a digital filter process on phase error data which is the result of the phase comparison.

As mentioned above, the processor performs the digital filter process on the phase error data, and thus the processor can generate frequency control data on the basis of the phase error data. The processor performs the temperature compensation process, the aging correction process, and the capacitance characteristic correction process along with the digital filter process. For example, a plurality of processes can be performed by sharing hardware such as a DSP. Consequently, a circuit scale of the processor can be reduced compared with a case where each process is performed by individual hardware.

In the aspect of the invention, the circuit device may further include a digital interface, and the oscillation signal generation circuit may generate the oscillation signal by using the frequency control data based on a result of the phase comparison in a first mode, and generate the oscillation signal by using the frequency control data based on externally generated frequency control data which is input via the digital interface in a second mode.

With this configuration, for example, a mode can be selected according to a use method desired by a user, and it is possible to perform switching between control of an oscillation frequency using an internal PLL and control of an oscillation frequency using an external PLL.

Another aspect of the invention relates to an oscillator including any one of the circuit devices; and a resonator that is used to generate the oscillation signal.

Another aspect of the invention relates to an electronic apparatus including anyone of the circuit devices.

Another aspect of the invention relates to a vehicle including any one of the circuit devices.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. The present embodiment described below is not intended to improperly limit the content of the invention disclosed in the appended claims, and all constituent elements described in the present embodiment are not essential as solving means of the invention.

1. Configuration

Figure 1:
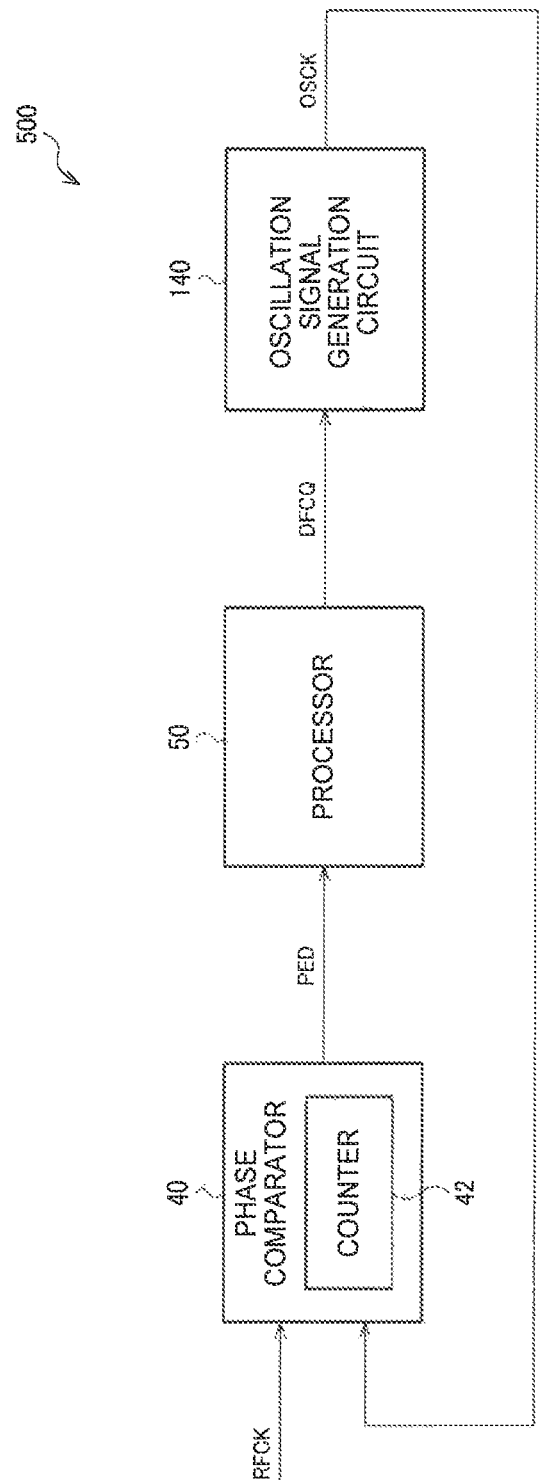
FIG. 1 is a diagram illustrating a configuration example of a circuit device according to an embodiment.

FIG. 1 is a diagram illustrating a configuration example of a circuit device 500 according to the present embodiment. The circuit device 500 includes a phase comparator 40 (phase comparison circuit), a processor 50 (processing circuit), and an oscillation signal generation circuit 140.

The phase comparator 40 compares a phase of an oscillation signal OSCK generated by the oscillation signal generation circuit 140 with a phase of a reference signal RFCK, and outputs a result thereof as phase error data PED. Specifically, the phase comparator 40 includes a counter 42 which counts the number of clocks of the oscillation signal OSCK, and outputs the phase error data PED on the basis of a count value in the counter 42. Here, the reference signal RFCK is a pulse signal which is input at a predetermined timing or at a predetermined interval, and is, for example, a signal used as a reference of time. For example, the reference signal RFCK is a reference signal (time pulse) output from a GPS receiver or a reference signal (clock signal) output from a physical layer circuit in a network.

Figure 2:
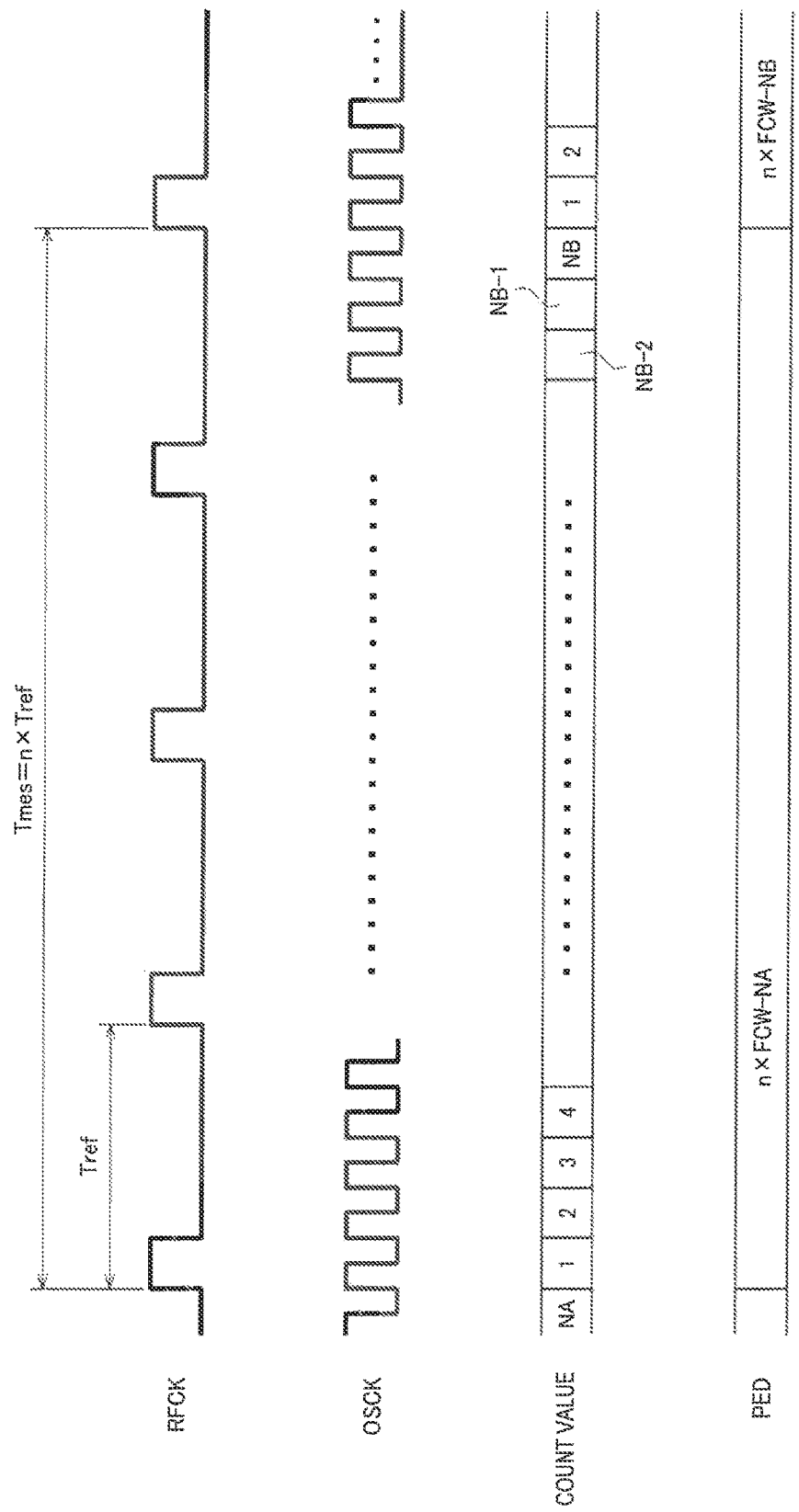
FIG. 2 is a timing chart for explaining an operation of a phase comparator.

FIG. 2 is a timing chart for explaining an operation of the phase comparator 40. As illustrated in FIG. 2, a cycle of the reference signal RFCK is indicated by Tref. For example, Tref is 1 second in a GPS reference signal. The counter 42 resets a count value thereof at, for example, a rising edge of the reference signal RFCK, and counts the number of clocks of the oscillation signal OSCK for a measurement time Tmes (measurement period) from the edge. The measurement time Tmes is a cycle for performing phase comparison, and corresponds to n cycles of the reference signal RFCK. In other words, phase errors accumulated for the measurement time Tmes are detected. As will be described later, n is an integer which can be set to 2 or more. In a case where a count value when the measurement time Tmes is finished is indicated by NB, a difference (n×FCW−NB) between an expected value n×FCW and the count value NB is output as the phase error data PED. FCW indicates frequency setting data for setting a frequency of the oscillation signal OSCK.

Here, an exemplary case where the counter 42 is counted up from an initial value of "0" has been described, but any other configuration may be used. For example, as will be described later, there may be a configuration in which countdown is performed with the expected value n×FCW as an initial value, and a count value when the measurement time Tmes is finished becomes (n×FCW−NB).

The processor 50 performs various digital signal processes. Specifically, the processor 50 performs a digital signal process on the phase error data PED from the phase comparator 40, and generates frequency control data DFCQ for controlling a frequency of the oscillation signal OSCK. For example, the processor 50 performs a process of converting the phase error data PED corresponding to a difference between a count value and the expected value n×FCW into phase error data having time as the unit, or a loop filter process (digital filter process) on phase error data. The processor 50 may perform an offset adjustment process (an offset adjustment process between the reference signal RFCK and the oscillation signal OSCK) on phase error data, or various correction processes and the like on frequency control data having undergone the loop filter process. The correction process is, for example, a process (temperature compensation process) of compensating for temperature dependency of an oscillation frequency of a resonator, or a process (capacitance characteristic correction process) of correcting capacitance characteristics of a variable capacitance capacitor (a varicap or the like) for controlling an oscillation frequency. Alternatively, the correction process may be a process (aging correction process) of correcting a change over time in an oscillation frequency in a state in which an oscillator performs self-running oscillation during hold-over. The processor 50 may be implemented by an ASIC circuit such as a gate array, and may be implemented by a processor (for example, a central processing unit (CPU) or a digital signal processor (DSP)) and a program (program module) operating on the processor.

The oscillation signal generation circuit 140 generates the oscillation signal OSCK having an oscillation frequency set on the basis of the frequency control data DFCQ. For example, the oscillation signal generation circuit 140 generates the oscillation signal OSCK having an oscillation frequency which is set on the basis of the frequency control data DFCQ by using the frequency control data DFCQ from the processor 50 and a resonator. As an example, the oscillation signal generation circuit 140 causes the resonator to oscillate with an oscillation frequency set on the basis of the frequency control data DFCQ, so as to generate the oscillation signal OSCK.

The oscillation signal generation circuit 140 may be a circuit which generates the oscillation signal OSCK according to a direct digital synthesizer method. For example, the oscillation signal OSCK having an oscillation frequency set on the basis of the frequency control data DFCQ may be digitally generated by using an oscillation signal from the resonator (an oscillation source with a fixed oscillation frequency) as a reference signal. Alternatively, the oscillation signal generation circuit 140 may be a circuit which generates the oscillation signal OSCK having an oscillation frequency which is set on the basis of the frequency control data DFCQ without using a resonator. For example, the oscillation signal generation circuit 140 may be formed of a D/A conversion circuit which converts the frequency control data DFCQ into a control voltage, or a voltage controlled oscillation circuit (VCO) which oscillates at an oscillation frequency set on the basis of the control voltage. Alternatively, the oscillation signal generation circuit 140 may be formed of a CR oscillation circuit including a variable capacitor whose capacitance is variably controlled according to the frequency control data DFCQ. The CR oscillation circuit oscillates at an oscillation frequency set on the basis of the capacitance of the variable capacitor.

A PLL circuit is formed of the phase comparator 40, the processor 50, the oscillation signal generation circuit 140, and thus the oscillation signal OSCK synchronized with the reference signal RFCK is generated. In other words, the processor 50 performs negative feedback control on the phase error data PED through proportional-integral (PI) control or the like, so as to generate the frequency control data DFCQ in which a phase error is reduced (close to zero). The oscillation signal generation circuit 140 generates the oscillation signal OSCK on the basis of the frequency control data DFCQ, and thus generates the oscillation signal OSCK synchronized with the reference signal RFCK.

Meanwhile, there is the need for high accuracy of an oscillation frequency of an oscillation signal in an oscillator such as an OCXO or TCXO. For example, as a communication method between abase station and a communication terminal, various methods such as frequency division duplex (FDD) or time division duplex (TDD) have been proposed. In the TDD method, data is transmitted and received in a time division manner by using the same frequency in uplink and downlink, and a guard time is set between time slots allocated to respective apparatuses. Thus, it is necessary for each apparatus to perform time synchronization in order to realize appropriate communication, and thus an accurate absolute time is required to be measured. In other words, since it is necessary to provide a plurality of base stations in order to realize a wireless communication system in a wide area in a mobile phone or a terrestrial digital broadcast, if measured times between the base stations are different from each other, appropriate communication cannot be realized. Thus, it is necessary for an oscillator used in a base station or the like to have very high frequency stability during hold-over. There is the need for high accuracy of an oscillation frequency, and there is also the need for miniaturization of a circuit device incorporated into an oscillator and miniaturization of circuits.

Therefore, the circuit device 500 of the present embodiment includes the phase comparator 40 which performs phase comparison between an input signal based on the oscillation signal OSCK and the reference signal RFCK; the processor 50 which performs a signal process on frequency control data based on a result of the phase comparison; and the oscillation signal generation circuit 140 which generates the oscillation signal OSCK having an oscillation frequency which is set on the basis of the frequency control data DFCQ having undergone the signal process from the processor 50. The phase comparator 40 includes the counter 42 which performs a count operation by using an input signal, and performs phase comparison of comparing a count value in the counter 42 in n (where n is an integer which can be set to 2 or more) cycles of the reference signal RFCK with the expected value n×FCW of the count value in an integer.

Here, an input signal based on the oscillation signal OSCK is the oscillation signal OSCK as described in FIG. 1, for example. However, the invention is not limited thereto, and an input signal may be a signal obtained by buffering the oscillation signal OSCK, and may be a signal obtained through division of the oscillation signal OSCK. Here, n being an integer which can be set to 2 or more indicates that n can be set to an integer of 2 or more regardless of n being fixed or variable. In other words, in a case where n is fixed, n is set to any one of integers of 2 or more. In a case where n is set to be variable, n is variably set to anyone of a plurality of integers including integers of 2 or more. A plurality of integers which can be set may further include 1. In addition, n may be set in a register circuit (for example, the register circuit 32 illustrated in FIG. 7) from an external device of the circuit device 500, or may be set by the circuit device 500 as will be described later in FIG. 6 or the like. Alternatively, n may be set by using a set value stored in a nonvolatile memory (for example, the register circuit 32 illustrated in FIG. 7), fuses, and the like. Performing a signal process on frequency control data based on a phase comparison result indicates that, for example, as described in FIG. 1, the processor 50 performs a loop filter process on the phase error data PED from the phase comparator 40 so as to generate frequency control data (frequency control data based on a phase comparison result), and performs a signal process on the frequency control data. The invention is not limited thereto, and the phase comparator 40 may convert phase error data PED into frequency control data (frequency control data based on a phase comparison result), and the processor 50 may perform a signal process on the frequency control data.

According to the present embodiment, the phase comparator 40 performs phase comparison of comparing a count value in the counter 42 with an expected value in integers, and thus the phase comparator 40 can be formed with a simple configuration. Phase comparison results are expressed in integers, and thus it is possible to simplify a process on a phase error. For example, in a case of phase comparison of comparing a count value and an expected value in decimals, it is necessary to provide a configuration of obtaining an integer part of a phase error and a configuration of obtaining a decimal part of the phase error. The configuration of obtaining a decimal part requires, for example, a fast analog phase comparison circuit, and thus a circuit scale increases. In relation to this fact, in the present embodiment, it is possible to reduce a circuit scale.

However, in a case where a count value and an expected value are compared with each other in integers, a phase error in the decimal accuracy cannot be detected, and thus a time resolution (the minimum phase error which can be detected) of a phase error increases compared with a case where a count value and an expected value are compared with each other in decimals. In relation to this fact, according to the present embodiment, the phase comparator 40 compares a count value in the counter 42 in n cycles of the reference signal RFCK with the expected value n×FCW of the count value in integers. In addition, n can be set to 2 or more. Consequently, the time resolution of a phase error can be reduced.

Figure 3:
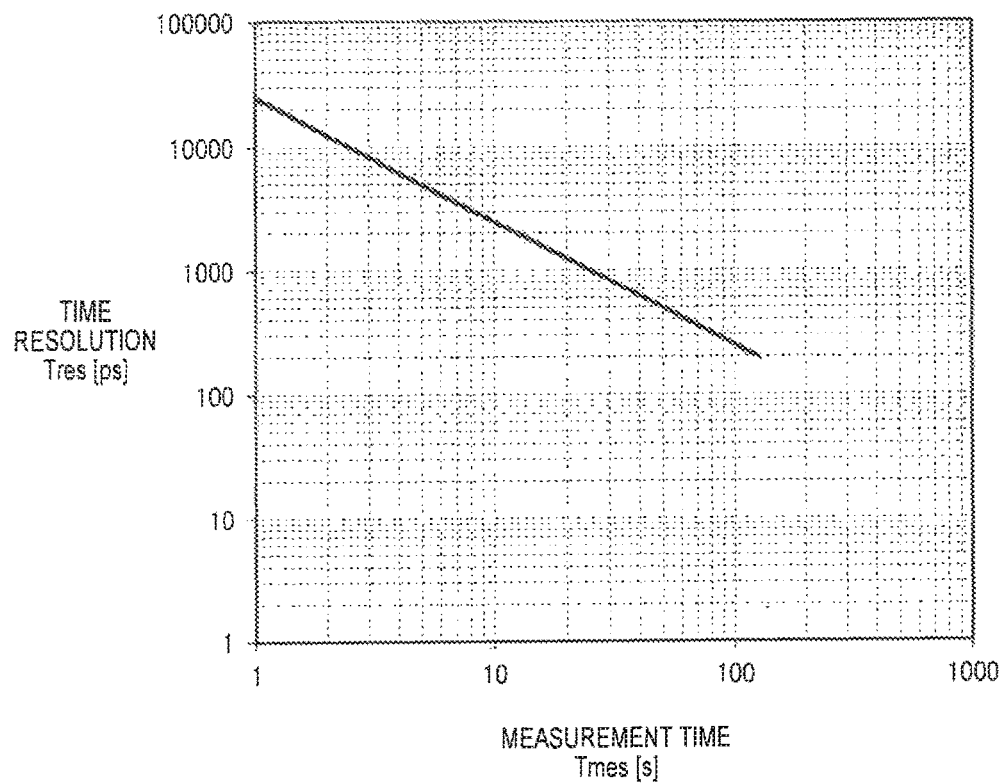
FIG. 3 is a diagram illustrating a relationship between measurement time and a time resolution.

Specifically, the time resolution Tres of a phase error is expressed by the following Equation (1). Tout indicates a cycle of the oscillation signal OSCK. FIG. 3 is a diagram illustrating a relationship between the measurement time Tmes and the time resolution Tres. FIG. 3 illustrates an example of a case where a cycle Tref of the reference signal RFCK is 1 second, and an oscillation frequency (1/Tout) is 40 MHz.

$$Tres = \frac{Tout}{Tmes/Tref} = \frac{Tout}{n} \qquad (1)$$

It can be seen from the above Equation (1) and FIG. 3 that n is set to 2 or more so that the measurement time Tmes is increased, and thus the time resolution Tres is reduced. In other words, in the present embodiment, since n can be set to 2 or more, an oscillation signal can be synchronized with the reference signal RFCK with high accuracy, and thus an oscillation frequency can be made highly accurate.

In the present embodiment, n may be set to k1 (where k1 is an integer of 2 or more) in at least a lock state of the PLL circuit including the phase comparator 40.

For example, n is set to k1 in either one of a lock state and an unlock state. Alternatively, n is set to k1 in a lock state, and n is set to an integer which is not k1 and is equal to or more than 1 in an unlock state.

As mentioned above, since n is set to an integer of 2 or more in the lock state, the time resolution of a phase error in the lock state is reduced, and thus an oscillation signal which is synchronized with the reference signal RFCK with high accuracy can be generated.

In the present embodiment, n may be set to k2 (where k2 is an integer of 1 or more and below k1) at the time of starting of the PLL circuit.

The time of starting of the PLL circuit is the time (a so-called pull-in state) until the oscillation signal OSCK is synchronized with the reference signal RFCK after the PLL circuit starts an operation of synchronizing the oscillation signal OSCK with the reference signal RFCK. For example, the time of starting of the PLL circuit is the time when the PLL circuit is brought into an operation state (enable) in a state in which the reference signal RFCK is input to the phase comparator 40, or the time when inputting of the reference signal RFCK is started in a case where the PLL circuit is in an operation state (enable).

For example, as will be described later in FIG. 6, the circuit device 500 may control n, so as to set n=k2 which is less than n=k1 in a lock state, at the time of starting of the PLL circuit. Alternatively, n may be controlled from an external device of the circuit device 500, so that n=k2 which is less than n=k1 in a lock state is set at the time of starting of the PLL circuit. In this case, for example, the external device may set n=k2 for a predetermined time at the time of starting of the PLL circuit, or the circuit device 500 may output a lock detection signal DTL' to the external device, and the external device may set n=k2 on the basis of the signal at the time of starting of the PLL circuit.

As mentioned above, since n=k2 less than n=k1 in a lock state is set at the time of starting of the PLL circuit, the measurement time Tmes (that is, a cycle for phase comparison) is reduced, and thus the time until the lock state occurs from starting of a synchronization operation can be reduced. In other words, it is possible to achieve the same effect as in so-called gear shift which will be described later in FIG. 5.

In the present embodiment, n is set to k3 (where k3 is an integer of 1 or more and below k1) in the test mode.

The test mode is a mode which is set when an operation of the circuit device 500 is tested, for example, in test before shipment of the circuit device 500 or test before shipment of an electronic apparatus or the like into which the circuit device 500 is incorporated. For example, the test mode is set in a register circuit (for example, the register circuit 32 illustrated in FIG. 7) from an external device such as a tester.

For example, in a case where the test mode is set, the circuit device 500 may automatically set n=k3. Alternatively, n=k3 may be set in the register circuit from an external device such as a tester. Here, k3 may be an integer which is the same as k2, and may be an integer which is different from k2.

As mentioned above, since n=k3 less than n=k1 in a lock state is set in the test mode, the time until the lock state occurs from starting of a synchronization operation can be reduced. Consequently, it is possible to reduce the time required to test the circuit device 500 or an electronic apparatus into which the circuit device 500 is incorporated.

In the present embodiment, n may be set to be variable.

For example, as will be described later in FIG. 6, the circuit device 500 may set n to be variable. Alternatively, n may be set to be variable from an external device of the circuit device 500 via the register circuit or the like.

If n is set to be variable, n may be set to a great integer of 2 or more in order to obtain a highly accurate oscillation frequency in a lock state. On the other hand, n may be set to an integer smaller than that in the lock state in order to reduce the pull-in time during starting or the test mode.

In the present embodiment, in a case where n is set to k4 (where k4 is an integer of 1 or more and below k1), the phase comparator 40 sets n to k5 (where k5 is an integer of 2 or more and k1 or less) more than k4 if a difference between a count value and the expected value n×FCW is equal to or less than a predetermined value.

With this configuration, in a case where a phase error is equal to or less than a predetermined value, n is set to a greater integer. Consequently, in a case where a lock state (or a state similar thereto) occurs with respect to an initially set value of n, a greater value of n is set next, and in a case where a lock state occurs with respect to the set value of n, a further greater value of n is set next. A lock state in a final value of n can be reached while repeating this operation.

In the present embodiment, a gain adjustment coefficient for a phase comparison result is set depending on a value of n.

The gain adjustment coefficient is a coefficient which depends on a value of n multiplied by a phase comparison result. For example, in FIG. 6, a conversion coefficient Kpe multiplied by the phase error data PED by the phase error converter 51 corresponds to the gain adjustment coefficient. The conversion coefficient Kpe is a coefficient used to convert a phase error at a count value into a phase-time difference per second.

According to the present embodiment, in a case where n is set to be variable, a gain adjustment coefficient is set depending on a value of n. Consequently, a coefficient which depends on a value of n multiplied by a phase comparison result can be set to an appropriate coefficient, and calculation on the phase comparison result can be performed.

In the present embodiment, the phase comparator 40 shifts bits of frequency setting data FCW depending on a value of n so as to obtain an expected value n×FCW, and performs comparison between the obtained expected value n×FCW and a count value as phase comparison. Details thereof will be described in FIG. 6.

With this configuration, since bits of the frequency setting data FCW are shifted depending on a value of n, the value of n is multiplied by the frequency setting data FCW, and thus the expected value n×FCW of a count value can be obtained. If the expected value n×FCW is compared with the count value, it is possible to perform phase comparison in n cycles of the reference signal RFCK. Multiplication is performed through bit shifting, and thus a circuit scale can be reduced more than in a case of using a multiplier. For example, if n is set to powers of 2, it is possible to realize multiplication through bit shifting.

In the present embodiment, the counter 42 counts down by using an input signal in n cycles (measurement time Tmes) of the reference signal RFCK with the expected value n×FCW obtained through bit shifting as an initial value, and outputs a count value obtained through countdown as a phase comparison result.

With this configuration, the expected value n×FCW obtained through bit shifting is set as an initial value of a count value. Countdown is performed from the initial value n×FCW, and thus a count value after the measurement time Tmes elapses can be obtained as a phase comparison result. Consequently, it is not necessary to provide a subtractor which subtracts a count value from the expected value n×FCW, and thus a circuit configuration of the phase comparator 40 can be simplified.

In the present embodiment, the processor 50 performs, as signal processes (digital signal processes), at least one of a temperature compensation process, an aging correction process, and a process of correcting capacitance characteristics of a variable capacitance capacitor connected to a resonator for generating the oscillation signal OSCK, and also performs a digital filter process (loop filter process) on the phase error data PED which is a phase comparison result. Details of the temperature compensation process, the aging correction process, and the capacitance characteristic correction process will be described later.

As mentioned above, the processor 50 performs the digital filter process on the phase error data PED, and thus the processor 50 can generate frequency control data on the basis of the phase error data PED. Details of generation of the frequency control data will be described later in FIG. 4 and the like. The processor 50 performs the temperature compensation process, the aging correction process, and the capacitance characteristic correction process in a time division manner along with the digital filter process. For example, a DSP which will be described later in FIG. 14 executes a program in which the content of each process is described, and thus a plurality of processes can be performed by sharing a single item of hardware. Consequently, a circuit scale of the processor 50 can be reduced compared with a case where each process is performed by individual hardware.

As will be described later in FIG. 7, the circuit device 500 may include the digital interface 30. The oscillation signal generation circuit 140 generates the frequency control data DFCQ and the oscillation signal OSCK based on phase comparison results in a first mode (internal PLL mode), and generates the frequency control data DFCQ and the oscillation signal OSCK based on externally generated frequency control data (DFCE in FIG. 7) which is input via the digital interface 30 in a second mode (external PLL mode).

With this configuration, for example, a mode can be selected according to a use method desired by a user, and switching between control of an oscillation frequency using an internal PLL and control of an oscillation frequency using an external PLL can be performed. For example, in a case of a user who wants to cheaply obtain a synchronization clock of a small base station or the like, it is desirable to obtain a synchronization clock at low cost by using the circuit device 500 in the first mode. On the other hand, a user having knowhow on a method of generating a synchronization clock can utilize the knowhow by forming an external PLL and using the circuit device 500 in the first mode.

2. First Detailed Configuration of Circuit Device

Figure 4:
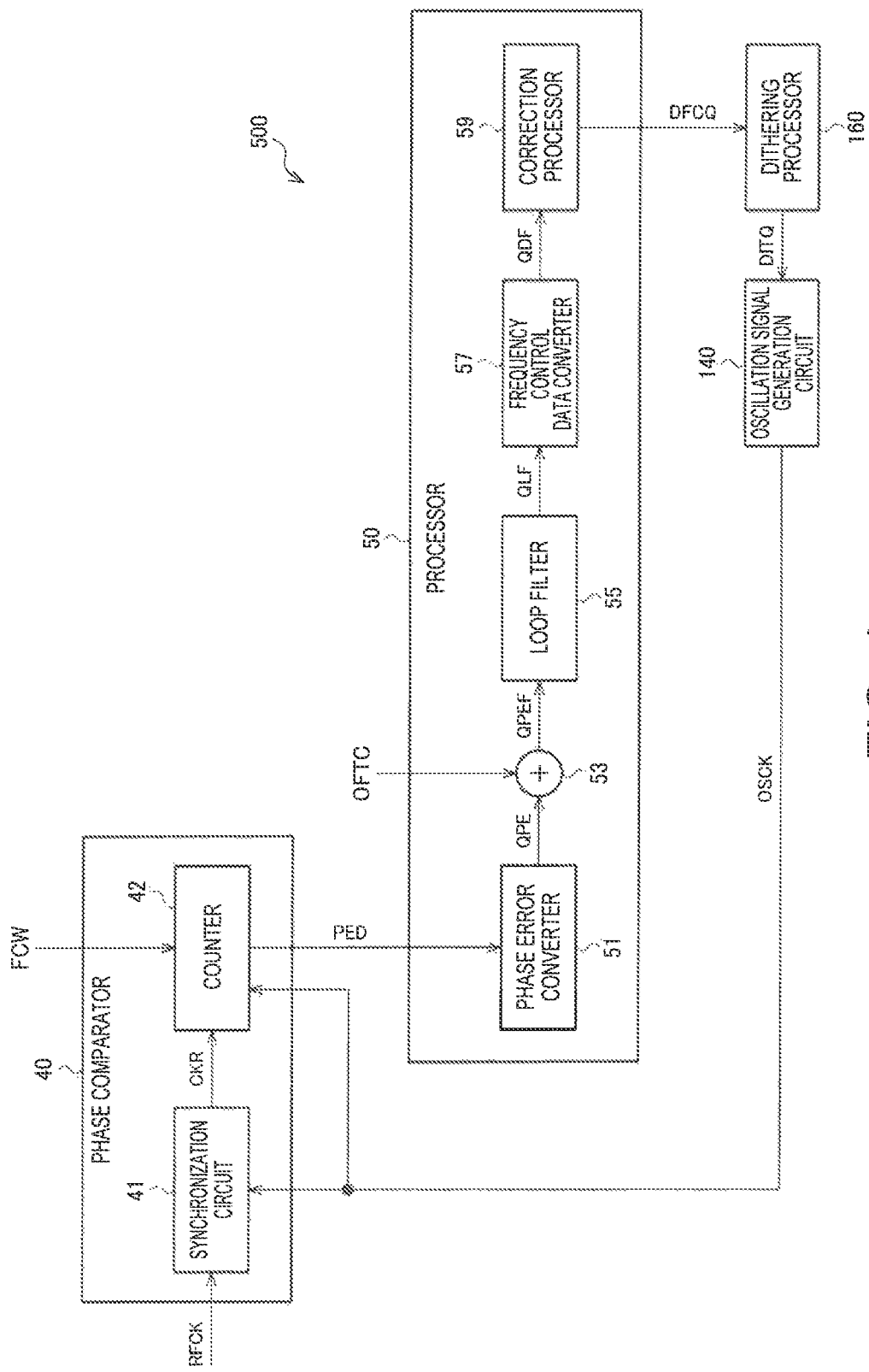
FIG. 4 is a diagram illustrating a first detailed configuration example of the circuit device, a detailed configuration example of the phase comparator, and a first detailed configuration example of a processor according to the embodiment.

FIG. 4 is a diagram illustrating a first detailed configuration example of the circuit device 500, a detailed configuration example of the phase comparator 40, and a first detailed configuration example of the processor 50 according to the present embodiment. The circuit device 500 includes the phase comparator 40, the processor 50, a dithering processor 160, and the oscillation signal generation circuit 140. The phase comparator 40 includes a synchronization circuit 41 and the counter 42. The processor 50 includes a phase error converter 51, an adder 53, a loop filter 55, a frequency control data converter 57, and a correction processor 59.

The synchronization circuit 41 synchronizes the reference signal RFCK with the oscillation signal OSCK. Specifically, the synchronization circuit 41 is formed of a flip-flop circuit or the like which incorporates the reference signal RFCK by using the oscillation signal OSCK. In other words, the synchronization circuit 41 incorporates a logic level of the reference signal RFCK at an edge of the oscillation signal OSCK with the flip-flop circuit, and outputs a clock signal CKR (or a pulse signal) whose logic level changes in synchronization with the edge of the oscillation signal OSCK.

The counter 42 sets a count value to the expected value n×FCW at a rising edge (or a falling edge) of the clock signal CKR, and counts down the number of clocks of the oscillation signal OSCK from the expected value n×FCW. A count value at a rising edge (or a falling edge) after n cycles of the clock signal CKR is output as the phase error data PED. Here, FCW indicates frequency setting data, and is input from, for example, the register circuit 32 in FIG. 7. For example, the frequency setting data FCW is written to the register circuit 32 from an external device via the digital interface 30. Alternatively, the frequency setting data FCW stored in the storage 34 may be read to the register circuit 32.

The phase error converter 51 converts the phase error data PED which is a difference between a count value inn cycles of the reference signal RFCK and the expected value n×FCW into a time difference corresponding to a phase difference between the reference signal RFCK and the oscillation signal OSCK for one second, and outputs the phase error data QPE as a result of the conversion. Specifically, calculation expressed by the following Equations (2) and (3) is performed. Here, Kpe indicates a conversion coefficient, fref indicates a frequency of the reference signal RFCK, and fout indicates a frequency of the oscillation signal OSCK.

$$QPE = Kpe \times PED \tag{2}$$

$$Kpe = \frac{fref}{n \times fout} \tag{3}$$

The adder 53 performs a process of adding the offset adjustment data OFTC to the phase error data QPE, and outputs the phase error data QPEF as a result of the addition process (offset adjustment). The offset adjustment data OFTC is data for offset adjusting a phase difference between the reference signal RFCK and the oscillation signal OSCK. Since negative feedback control is performed so that a phase error after the offset adjustment is performed becomes zero, a phase error corresponding to the offset adjustment data OFTC is added between the reference signal RFCK and the oscillation signal OSCK in a lock state. The offset adjustment data OFTC is input from, for example, the register circuit 32 in FIG. 7. The offset adjustment function may be selected to be enabled or disabled, and, in a case where the offset adjustment function is set to be disabled, the adder 53 outputs the phase error data QPE as the phase error data QPEF.

The loop filter 55 performs a digital filter process on the phase error data QPEF having undergone the offset adjustment, and outputs a result thereof as output data QLF. The digital filter process has, for example, a low-pass characteristic or a band-pass characteristic. For example, the loop filter 55 performs a process in which a proportion process of multiplying the phase error data QPEF by a coefficient is combined with an integration process of integrating the phase error data QPEF. A process performed by the loop filter 55 is not limited thereto, and may be a process of calculating the output data QLF so that the phase error data QPEF is close to zero (that is, the phase error data QPEF converges on the output data QLF when the PLL circuit is locked).

The frequency control data converter 57 converts the output data QLF from the loop filter 55 into frequency control data QDF. Specifically, calculation expressed by the following Equations (4) and (5) is performed. Here, Kdco indicates a conversion coefficient. In addition, $2^{16}-1$ is a range (that is, DITQ is 16-bit data) of values of frequency control data DITQ which is input to the oscillation signal generation circuit 140. Further, fmax indicates an upper limit frequency of a frequency change range of the oscillation signal OSCK, and fmin indicates a lower limit frequency of the frequency change range of the oscillation signal OSCK. For example, a frequency of the oscillation signal OSCK obtained in a case where the frequency control data DITQ having the maximum value $2^{16}-1$ is input to the oscillation signal generation circuit 140 is fmax, and a frequency of the oscillation signal OSCK obtained in a case where the frequency control data DITQ having the minimum value 0 is input to the oscillation signal generation circuit 140 is fmin. The invention is not limited thereto, and, for example, a margin may be provided so that fmax and fmin may be set outside an actual oscillation frequency change range corresponding to a range of values of the frequency control data DITQ. For example, individual variations of resonators or the like may be measured, and fmax and fmin may be set on the basis of measurement results. Here, the frequency control data DITQ is 16 bits, but the frequency control data DITQ is not limited to 16 bits.

$$QDF = Kdco \times QLF \quad (4)$$

$$Kdco = \frac{(2^{16}-1) \times fout}{fmax - fmin} \quad (5)$$

The correction processor 59 performs various correction processes on the frequency control data QDF so as to output the frequency control data DFCQ having undergone the correction processes. As described above, the correction processes are, for example, the temperature compensation process and the capacitance characteristic correction process. The correction processor 59 may perform the aging correction process during hold-over so as to generate the frequency control data DFCQ.

Each element of the processor 50 may be formed of individual hardware, and may be formed of a program operating on the processor. In a case where each element of the processor 50 is formed of the program, for example, each element of the processor 50 is formed of a program module corresponding thereto. The program may be stored as data in a ROM or the like, and may be implemented in hardware such as a gate array which outputs data corresponding to the program.

The dithering processor 160 performs a dithering process on the frequency control data DFCQ so as to output the frequency control data DITQ having undergone the dithering process. The oscillation signal generation circuit 140 generates the oscillation signal OSCK having an oscillation frequency which is set on the basis of the frequency control data DITQ. For example, the processor 50 performs calculation by using 32-bit floating-point data. The dithering processor 160 converts the frequency control data DFCQ which is 32-bit floating-point data into the frequency control data DITQ which is 16-bit integer data, and performs a dithering process during the conversion. For example, the dithering process is a process of reducing or randomizing a quantization error when rounding off broken numbers.

3. Second Detailed Configuration of Circuit Device

Figure 5:
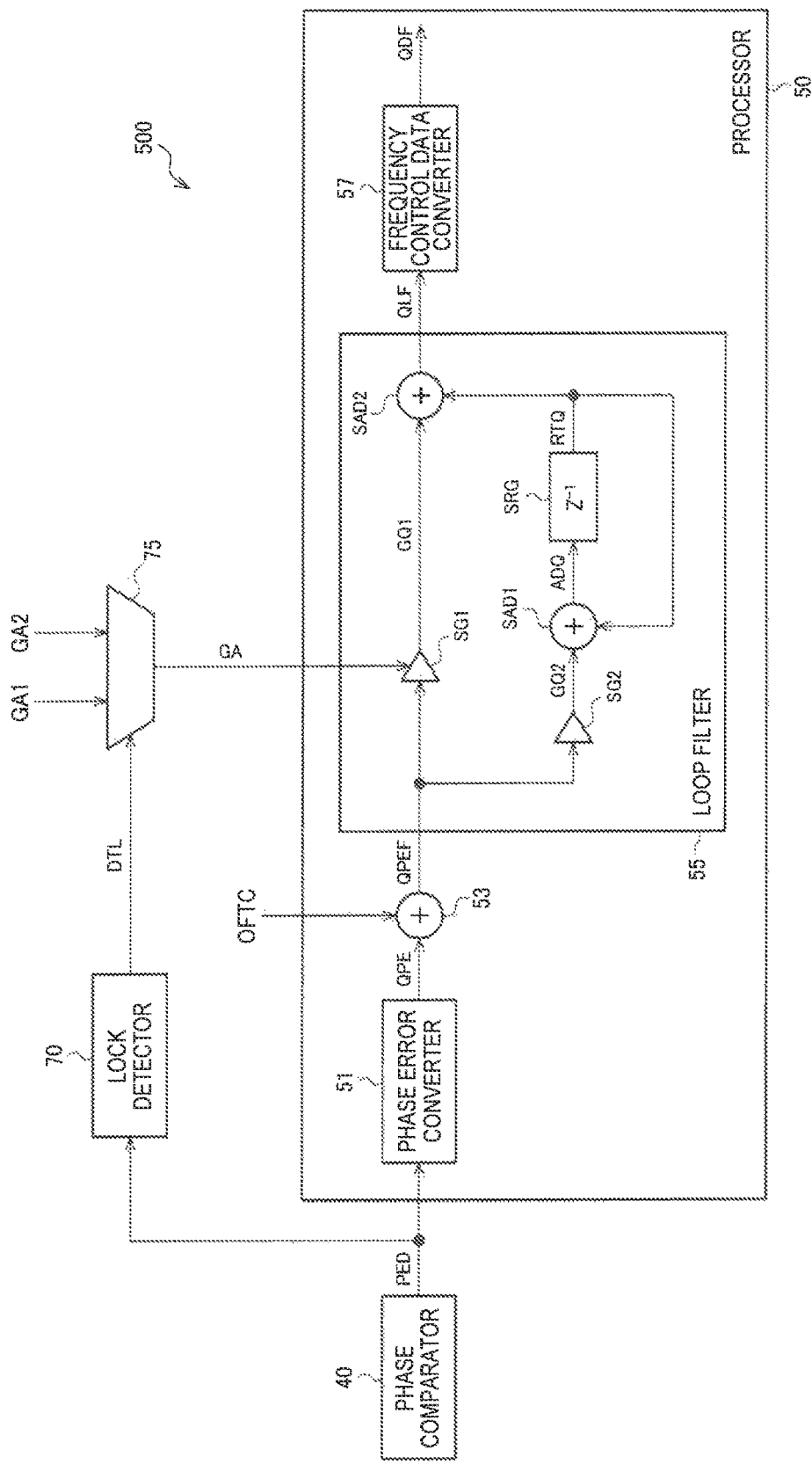
FIG. 5 is a diagram illustrating a second detailed configuration example of the circuit device and a detailed configuration example of a loop filter according to the embodiment.

FIG. 5 is a diagram illustrating a second detailed configuration example of the circuit device 500 and a detailed configuration example of the loop filter 55 according to the present embodiment. FIG. 5 does not illustrate the correction processor 59, the dithering processor 160, and the oscillation signal generation circuit 140.

The circuit device 500 includes the phase comparator 40, the processor 50, a lock detector 70 (lock detection circuit), and a selector 75. In FIG. 5, the loop filter 55 includes multipliers SG1 and SG2, adders SAD1 and SAD2, and a register SRG.

The lock detector 70 detects whether or not the PLL circuit is in a lock state on the basis of the phase error data PED, sets a lock detection signal DTL to be inactive (a first logic level; for example, a low level) in a case where the PLL circuit is not in a lock state, and sets the lock detection signal DTL to be active (a second logic level; for example, a high level) in a case where the PLL circuit is in a lock state. For example, the lock detector 70 determines that the PLL circuit is in a lock state in a case where the phase error data PED is within a predetermined range. For example, in a case where the phase error data PED is "0" in a lock state, the PLL circuit is determined as being in a lock state if $-1 \leq PED \leq +1$. The lock detector 70 is formed of, for example, a logic circuit. The lock detector 70 may be included in the processor 50.

The selector 75 selects a coefficient for a proportion process in the loop filter 55 on the basis of the lock detection signal DTL. Specifically, the selector 75 selects a coefficient GA1 in a case where the lock detection signal DTL is inactive, and selects a coefficient GA2 in a case where the lock detection signal DTL is active. The selector 75 outputs the selected coefficient as a coefficient GA. The coefficient GA2 is expressed in the following Equation (6). The coefficient GA1 is a coefficient satisfying a range shown in the following Expression (7). Here, fc indicates a cutoff frequency of the loop filter 55. The coefficients GA1 and GA2 are input from, for example, the register circuit 32 in FIG. 7.

$$GA2 = \frac{2\pi fc}{fref} \quad (6)$$

$$GA2 \leq GA1 \leq 1 \quad (7)$$

The multiplier SG1 of the loop filter 55 multiplies the phase error data QPEF by the coefficient GA for the proportion process so as to output a result thereof as output data GQ1.

The multiplier SG2 multiples the phase error data QPEF by a coefficient GRH for an integration process so as to output a result thereof as output data GQ2. The coefficient GRH is a coefficient satisfying a range shown in the following Expression (8). The coefficient GRH is input from, for example, the register circuit 32 in FIG. 7.

$$0 \leq GRH \leq \frac{(GA2)^2}{2} \quad (8)$$

The adder SAD1 and the register SRG form an integrator. In other words, the adder SAD1 adds the output data GQ2 to output data RTQ from the register SRG, so as to output a result thereof as output data ADQ. The register SRG holds the output data ADQ, and outputs the held data as the output data RTQ.

The adder SAD2 adds the output data GQ1 which is a result of the proportion process to the output data RTQ which is a result of the integration process, and outputs a result thereof as output data QLF. A transfer function H(z) of the loop filter 55 is as in the following Equation (9).

$$H(z) = \frac{GA2 + (GRH - GA2)z^{-1}}{1 - z^{-1}} \quad (9)$$

The coefficient GA1 for the proportion process selected in an unlock state is used for a function (hereinafter, referred to as gear shift function) of reducing the time required for the unlock state to converge on a lock state. In other words, as shown in the above Expression (7), in the unlock state, the proportion process is performed by using the coefficient GA1 more than the coefficient GA2 in the lock state. Consequently, an effect (negative feedback for a phase error) of causing a phase error to converge acts more strongly than in a lock state, and the time required to converge on a lock state is reduced more than in a case where the gear shift function is not used.

4. Modification Example of Counter

Figure 6:
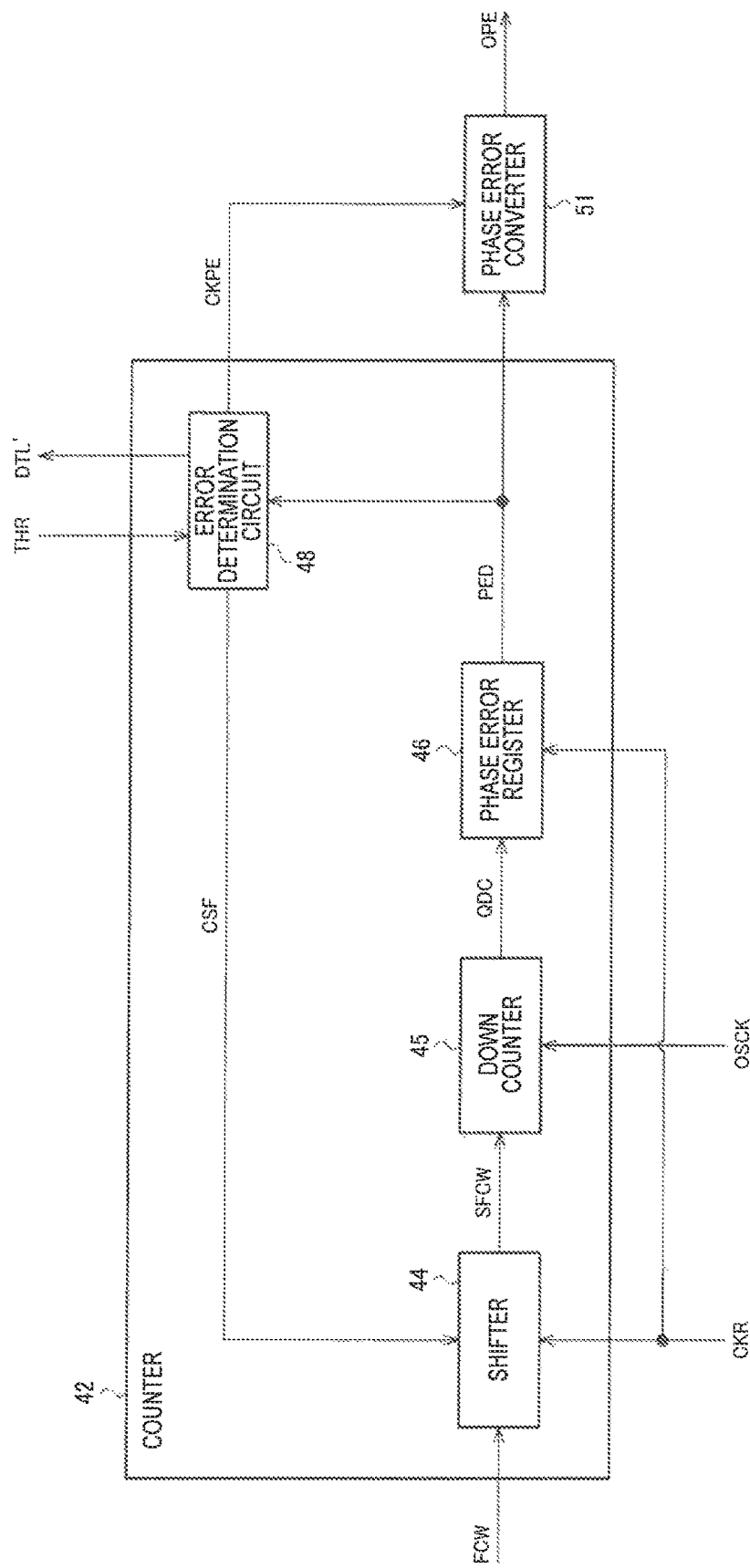
FIG. 6 is a diagram illustrating a modified configuration example of a counter.

FIG. 6 illustrates a modified configuration example of the counter 42. The counter 42 includes a shifter 44, a down counter 45, a phase error register 46, and an error determination circuit 48.

In this modification configuration example, the measurement time Tmes is controlled to be variable, and thus a function equivalent to the gear shift function is realized. In a case of using the modified configuration example, constituent elements (the lock detector 70 and the selector 75) related to the gearshift function in FIG. 5 may be omitted.

The shifter 44 shifts bits of the frequency setting data FCW in a shift amount corresponding to a shift amount control signal CSF. Specifically, n in the measurement time Tmes=n×Tref can be set to 2j (where j is an integer of 0 or more), and j indicates a shift amount. The shifter 44 shifts the frequency setting data FCW toward the MSB side by j bits, and outputs a result thereof as an expected value SFCW (=n×FCW). The shifter 44 updates the expected value SFCW at a rising edge (or a falling edge) of the clock signal CKR.

The down counter 45 initializes a count value to the expected value SFCW at a rising edge (or a falling edge) of the clock signal CKR. The down counter 45 counts down by using the oscillation signal OSCK up to a rising edge (or a falling edge) of the clock signal CKR for the measurement time Tmes, and outputs a count value QDC thereof.

The phase error register 46 incorporates the count value QDC in the down counter 45 at a rising edge (or a falling edge) of the clock signal CKR at the time of finishing of the measurement time Tmes, and outputs the incorporated count value as the phase error data PED.

The error determination circuit 48 determines whether or not an absolute value of the phase error data PED is equal to or smaller than a threshold value THR, and outputs the shift amount control signal CSF on the basis of a determination result. Specifically, the error determination circuit 48 increases a shift amount (the number of bits j) by 1 in a case where an absolute value of the phase error data PED is equal to or smaller than the threshold value THR. For example, a shift amount is increased by 1, such as j=0, 1, 2, . . . , and jmax. Here, jmax is the maximum value of a shift amount, and is a shift amount in a lock state (that is, n=2jmax in a lock state). An initial value of j may be an integer of 1 or more. In addition, j may be increased by an integer of 2 or more. The threshold value THR is input from, for example, the register circuit 32 in FIG. 7.

The error determination circuit 48 outputs a control signal CKPE for a conversion coefficient Kpe to the phase error converter 51 on the basis of the determination result. Specifically, the conversion coefficient Kpe depends on n as in the above Equation (3). The error determination circuit outputs the control signal CKPE for designating the conversion coefficient Kpe in a case of n=2j in conjunction with the shift amount j. For example, a conversion coefficient corresponding to each value of j may be stored in the register circuit 32 or the like in FIG. 7 in advance, and the phase error converter 51 may select the conversion coefficient Kpe according to the control signal CKPE. Alternatively, a conversion coefficient in a reference shift amount (for example, j=0) may be stored in the register circuit 32 or the like in FIG. 7, and the phase error converter 51 may perform calculation corresponding to the control signal CKPE on the conversion coefficient read from the register circuit 32 or the like so as to obtain the conversion coefficient Kpe.

The error determination circuit 48 outputs a lock detection signal DTL' on the basis of a determination result of whether or not an absolute value of the phase error data PED at j=jmax is equal to or smaller than the threshold value THR. In other words, in a case where an absolute value of the phase error data PED is equal to or smaller than the threshold value THR, the lock detection signal DTL' is made active.

5. Third Detailed Configuration of Circuit Device

Figure 7:
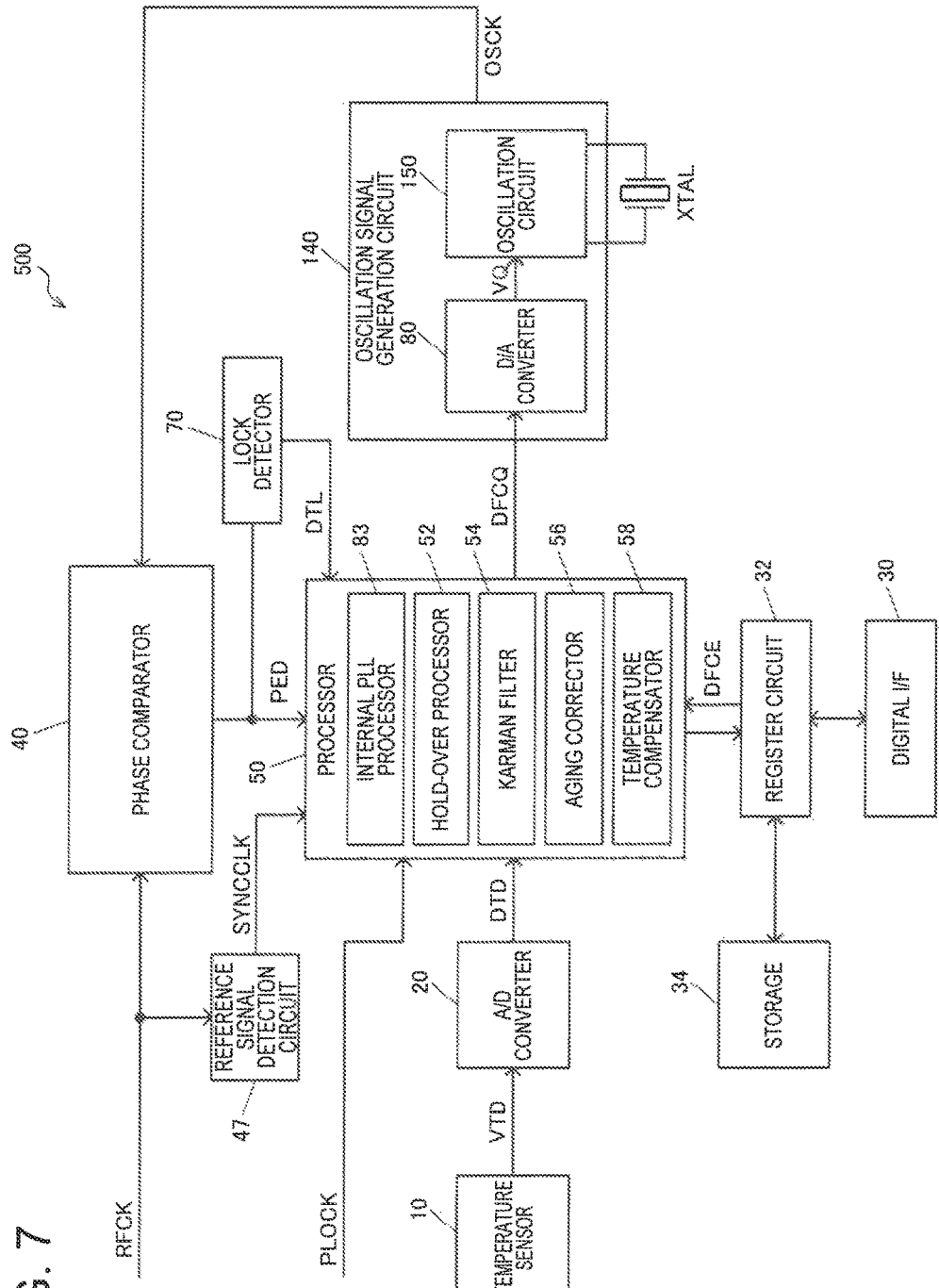
FIG. 7 is a third detailed configuration example of the circuit device according to the embodiment.

FIG. 7 is a diagram illustrating a third detailed configuration example of the circuit device 500 according to the present embodiment.

The circuit device 500 includes a temperature sensor 10, an A/D converter 20 (A/D conversion circuit), the digital interface 30 (digital interface circuit), the register circuit 32, the storage 34 (memory), the phase comparator 40, the processor 50, the lock detector 70, a reference signal detection circuit 47, and the oscillation signal generation circuit 140.

The temperature sensor 10 outputs a temperature detection voltage VTD. Specifically, a temperature-dependent voltage which changes depending on the temperature of the environment (circuit device 500) is output as the temperature detection voltage VTD. For example, the temperature sensor 10 may be formed of a diode or a bipolar transistor. A forward voltage of a PN junction included in the diode or the bipolar transistor corresponds to the temperature detection voltage VTD.

The A/D converter 20 performs A/D conversion on the temperature detection voltage VTD from the temperature sensor 10 so as to output temperature detection data DTD. For example, the digital temperature detection data DTD (A/D result data) corresponding to an A/D conversion result of the temperature detection voltage VTD is output. As an A/D conversion method in the A/D converter 20, for example, a successive comparison method or a method similar to the successive comparison method may be employed. An A/D conversion method is not limited to such methods, and various methods (a counting type, a parallel comparison type, and a series/parallel type) may be employed.

A resonator XTAL is provided outside the circuit device 500, and is, for example, an AT cut or SC cut quartz crystal resonator which is of a thickness shear vibration type, or a flexural vibration type piezoelectric resonator. The resonator XTAL may be a resonator (an electromechanical resonator or an electrical resonance circuit). As the resonator XTAL, a surface acoustic wave (SAW) resonator as a piezoelectric resonator, a microelectromechanical system (MEMS) resonator as a silicon resonator, and the like may be used. As a substrate material of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The oscillation signal generation circuit 140 includes a D/A converter 80 and the oscillation circuit 150. The D/A converter 80 performs D/A conversion on the frequency control data DFCQ from the processor 50. As a D/A conversion type of the D/A converter 80, for example, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A converter 80 may include a control circuit, a modulation circuit (a PWM circuit), a filter circuit, or the like, in addition to a D/A converter. The oscillation circuit 150 generates the oscillation signal OSCK by using an output voltage VQ from the D/A converter 80, and the resonator XTAL. The oscillation circuit 150 causes the resonator XTAL (a piezoelectric resonator, a resonator, or the like) to oscillate so as to generate the oscillation signal OSCK. Specifically, the oscillation circuit 150 causes the resonator XTAL to oscillate at an oscillation frequency at which the output voltage VQ of the D/A converter 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (a varicap or the like) whose capacitance value varies depending on a frequency control voltage.

The reference signal detection circuit 47 detects whether or not the reference signal RFCK is absent or abnormal, and outputs a reference signal detection signal SYNCCLK on the basis of a detection result. In a case where it is detected that the reference signal RFCK is present or normal, the detection signal SYNCCLK becomes active (second logic level). In a case where it is detected that the reference signal RFCK is absent or abnormal, the detection signal SYNCCLK becomes inactive (first logic level). For example, the reference signal detection circuit 47 detects whether or not the reference signal RFCK is absent or abnormal by monitoring a pulse (or a frequency) of the reference signal RFCK. For example, a pulse interval of the reference signal RFCK is measured with a counter or the like, and in a case where it is determined that pulses are not input for a predetermined period on the basis of a count value, the reference signal RFCK is determined as being absent or being abnormal. Alternatively, in a case where an input interval of pulses continues in a state of exceeding a predetermined range for a predetermined period on the basis of a count value, the reference signal RFCK is determined as being absent or being abnormal.

The storage 34 stores various pieces of information which is necessary in various processes or operations of the circuit device 500. The storage 34 may be implemented by, for example, a nonvolatile memory. As the nonvolatile memory, for example, an EEPROM may be used. For example, a metal-oxide-nitride-oxide-silicon (MONOS) type memory may be used as the EEPROM. Alternatively, memories of other types such as a floating gate type may be used as the EEPROM. The storage 34 may be implemented by, for example, a fuse circuit as long as information can be held and stored even in a state in which power is not supplied.

The register circuit 32 is a circuit formed of a plurality of registers such as a status register, a command register, and a data register. An external device (for example, a processor such as a CPU or an MPU) of the circuit device 500 accesses each register of the register circuit 32 via the digital interface 30. The external device can check a status of the circuit device 500, issue a command to the circuit device 500, transmit data to the circuit device 500, and read data from the circuit device 500, by using the register of the register circuit 32. The register circuit 32 stores information which is read from the storage 34. For example, parameters such as the above-described conversion coefficients Kpe and Kdco, the offset adjustment data OFTC, and the coefficients GA1, GA2 and GRH are stored in the storage 34. The parameters are read (initially loaded) to the register circuit 32, for example, at the time of starting of the circuit device 500. The processor 50 performs a process using the parameters by referring to the register circuit 32.

The processor 50 includes an internal PLL processor 83, a hold-over processor 52, a Karman filter 54, an aging corrector 56 (an aging correction processing circuit or a program module), and a temperature compensator 58. The Karman filter 54, the aging corrector 56, and the temperature compensator 58 correspond to the correction processor 59 in FIG. 4. The internal PLL processor 83 corresponds to the phase error converter 51, the adder 53, the loop filter 55, and the frequency control data converter 57 described in FIG. 4 or the like. Hereinafter, a process performed by the internal PLL processor 83 will be referred to as an internal PLL process. The hold-over processor 52 performs various processes regarding hold-over. The Karman filter 54 performs a process of estimating a true value for an observed value of frequency control data. The aging corrector 56 performs aging correction for compensating for a frequency change due to aging during hold-over. The temperature compensator 58 performs a temperature compensation process on an oscillation frequency on the basis of the temperature detection data DTD from the A/D converter 20.

The digital interface 30 is an interface for inputting and outputting digital data between the circuit device 500 and an external device (for example, a microcomputer or a controller). The digital interface 30 may be implemented on the basis of, for example, a synchronous serial communication method using serial clock lines and serial data lines. Specifically, the digital interface 30 may be implemented on the basis of an inter-integrated circuit (I2C) method or a 3-wire or 4-wire serial peripheral interface (SPI) method. The I2C method is a synchronous serial communication method of performing communication by using two signal lines such as a serial clock line SCL and a bidirectional serial data line SDA. The SPI method is a synchronous serial communication method of performing communication by using a serial clock line SCK and two unidirectional serial data lines SDI and SDO. The digital interface 30 is formed of an input/output buffer circuit, a control circuit, and the like realizing such a communication method.

The reference signal RFCK is input to the circuit device 500 via a connection terminal (pad) of the circuit device 500. A signal PLOCK for performing a notification of whether or not an external PLL circuit is in a lock state is input to the circuit device 500 via the connection terminal (pad) of the circuit device 500. The signal PLOCK may be input to the circuit device 500 via the digital interface 30. For example, the signal PLOCK becomes inactive in a case where the external PLL circuit is not in a lock state, and becomes active in a case where the external PLL circuit is in a lock state.

In the present embodiment, for example, if an external device writes mode setting information to the register circuit 32 via the digital interface 30, one of the internal PLL mode (first mode) and the external PLL mode (second mode) is set.

In the internal PLL mode, the processor 50 performs an internal PLL process on the basis of the phase error data PED from the phase comparator 40, so as to generate frequency control data (QDF in FIG. 4). The processor 50 performs signal processes such as a temperature compensation process on the frequency control data QDF so as to output the frequency control data DFCQ having undergone the signal processes to the oscillation signal generation circuit 140. The oscillation signal generation circuit 140 generates the oscillation signal OSCK by using the frequency control data DFCQ and the resonator XTAL so as to output the oscillation signal OSCK to the phase comparator 40. Consequently, a loop of a PLL circuit (internal PLL circuit) is formed by the phase comparator 40, the oscillation signal generation circuit 140, and the like.

In the external PLL mode, frequency control data DFCE (externally generated frequency control data) from an external frequency control data generator is input to the processor 50 via the digital interface 30. The processor 50 performs signal processes such as a temperature compensation process on the frequency control data DFCE so as to output the frequency control data DFCQ having undergone the signal processes to the oscillation signal generation circuit 140. The oscillation signal generation circuit 140 generates the oscillation signal OSCK by using the frequency control data DFCQ and the resonator XTAL so as to output the oscillation signal OSCK to the external frequency control data generator. Consequently, a loop of a PLL circuit (external PLL circuit) is formed by the external frequency control data generator, the oscillation signal generation circuit 140, and the like.

The external frequency control data generator compares an input signal based on the oscillation signal OSCK with the reference signal RFCK so as to generate the frequency control data DFCE. For example, the external frequency control data generator may include a comparison calculator which performs comparison calculation between the oscillation signal OSCK and the reference signal RFCK, and a digital filter which performs a smoothing process on phase error data. Alternatively, the external frequency control data generator may include a phase comparator of an analog circuit, a filter (loop filter) of an analog circuit, and an A/D converter.

6. Second Detailed Configuration of Processor

Figure 8:
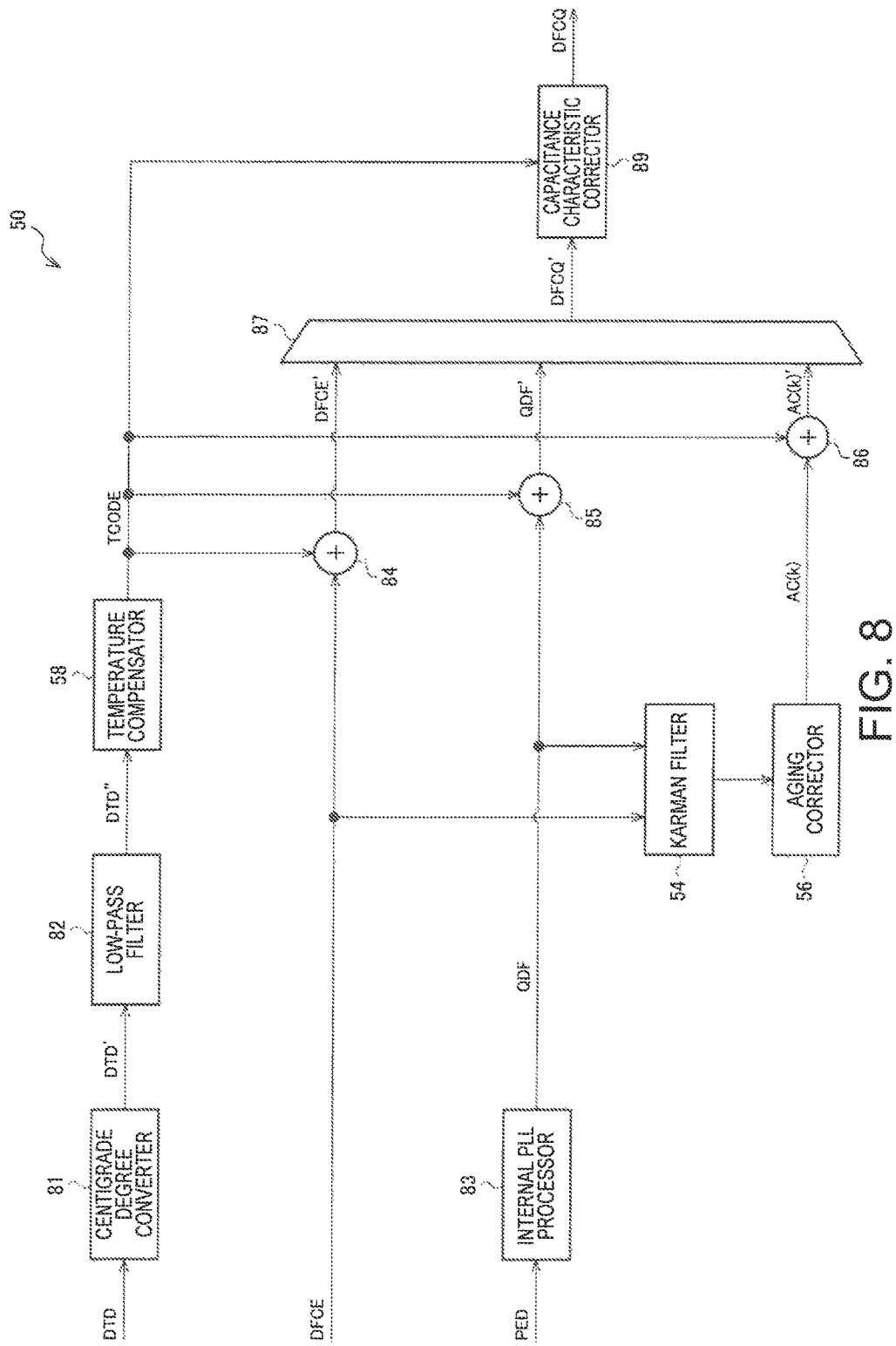
FIG. 8 is a second detailed configuration example of the processor.

FIG. 8 is a second detailed configuration example of the processor 50. The processor 50 includes a centigrade degree converter 81, a low-pass filter 82, the temperature compensator 58, the internal PLL processor 83, the Karman filter 54, the aging corrector 56, a capacitance characteristic corrector 89, adders 84, 85 and 86, and a selector 87. The Karman filter 54, the aging corrector 56, the temperature compensator 58, and the capacitance characteristic corrector 89 correspond to the correction processor 59 in FIG. 4.

The centigrade degree converter 81 converts the temperature detection data DTD into temperature detection data DTD' indicating a Celsius temperature (in a broad sense, corresponding to a Celsius temperature). For example, the temperature detection data DTD indicating nonlinear characteristics with respect to a Celsius temperature is converted into the temperature detection data DTD' indicating linear characteristics with respect to a Celsius temperature.

The low-pass filter 82 performs a digital filter process for smoothing a temporal change in the temperature detection data DTD' so as to output temperature detection data DTD" having undergone the digital filter process.

The temperature compensator 58 performs a temperature compensation process on the basis of the temperature detection data DTD", and generates temperature compensation data TCODE (temperature compensation code) for maintaining an oscillation frequency to be constant with respect to a temperature change. Specifically, information regarding coefficients $A_0$ to $A_5$ of a polynomial (approximate function) in Equation (10) is stored in the storage 34 in FIG. 7. Here, X corresponds to the temperature detection data DTD". The temperature compensator 58 reads the information regarding the coefficients $A_0$ to $A_5$ from the storage 34, and performs calculation expressed in the following Equation (10) on the basis of the coefficients $A_0$ to $A_5$ and the temperature detection data DTD" (=X) so as to generate the temperature compensation data TCODE.

$$TCODE = A_5 \cdot X^5 + A_4 \cdot X^4 + A_3 \cdot X^3 + A_2 \cdot X^2 + A_1 \cdot X + A_0 \quad (10)$$

The adder 84 adds the temperature compensation data TCODE to the frequency control data DFCE which is input from the external frequency control data generator in the external PLL mode, and outputs a result thereof as frequency control data DFCE'. The frequency control data DFCE may be output as the frequency control data DFCE'.

The internal PLL processor 83 performs an internal PLL process on the basis of the phase error data PED which is input from the phase comparator 40 in the internal PLL mode, and outputs the frequency control data QDF.

The adder 85 adds the temperature compensation data TCODE to the frequency control data QDF, and outputs a result thereof as frequency control data QDF'. The frequency control data QDF may be output as the frequency control data QDF'.

The Karman filter 54 performs a process of estimating a true value for an observed value of frequency control data (DFCE and QDF) through a Karman filter process in a period (normal operation period) before a hold-over state caused by the absence or abnormality of the reference signal RFCK is detected. This true value is a true value estimated through the Karman filter process, and thus cannot be said to be a real true value. A control process performed due to detection of a hold-over state is performed by the hold-over processor 52 illustrated in FIG. 7. Details of the Karman filter process will be described later.

The aging corrector 56 holds a true value at a timing corresponding to a detection timing of a hold-over state in a case where the hold-over state is detected. A timing at which the true value is held may be a timing at which a hold-over state is detected, and may be a timing prior to the timing. The aging corrector 56 generates frequency control data AC (k) having undergone aging correction by performing a calculation process based on the held true value. Details of the aging correction process will be described later.

The adder 86 adds the temperature compensation data TCODE to the frequency control data AC (k), and outputs a result thereof as frequency control data AC(k)'. The frequency control data AC(k) may be output as the frequency control data AC(k)'.

The selector 87 selects the frequency control data DFCE' in the external PLL mode during non-hold-over (normal operation), selects the frequency control data QDF' in the internal PLL mode during non-hold-over, and selects the frequency control data AC (k)' during hold-over. The selector 87 outputs the selected frequency control data as the frequency control data DFCQ'.

The capacitance characteristic corrector 89 performs a correction process on the frequency control data DFCQ' so that the frequency control data DFCQ' uniquely corresponds to an oscillation frequency (the same oscillation frequency is obtained with respect to the same frequency control data DFCQ'), and outputs a result thereof as the frequency control data DFCQ. Specifically, the variable capacitance capacitor (for example, CX1 in FIG. 17) of the oscillation circuit 150 changes the capacitance thereof for a control voltage depending on, for example, an individual variation or a temperature change. The capacitance characteristic corrector 89 performs correction of canceling (reducing) changes in capacitance characteristics. For example, the capacitance characteristic corrector 89 performs a first correction process of canceling (reducing) an individual variation of capacitance characteristics, a second correction process of canceling (reducing) a temperature change of the capacitance characteristics on the basis of the temperature compensation data TCODE, and a third correction process of canceling (reducing) nonlinearity of the capacitance characteristics (capacitance characteristics for the frequency control data DFCQ' are made linear). The first to third correction processes are performed through calculation of correction expressions corresponding to the respective correction processes. Parameters (coefficients and the like) used for the correction expressions are stored in, for example, the storage 34 in FIG. 7. The parameters are read to the register circuit 32 from the storage 34, and are input to the processor 50 from the register circuit 32. Each of the first to third correction processes may be selected to be enabled and disabled.

7. Process Flow

Figure 9:
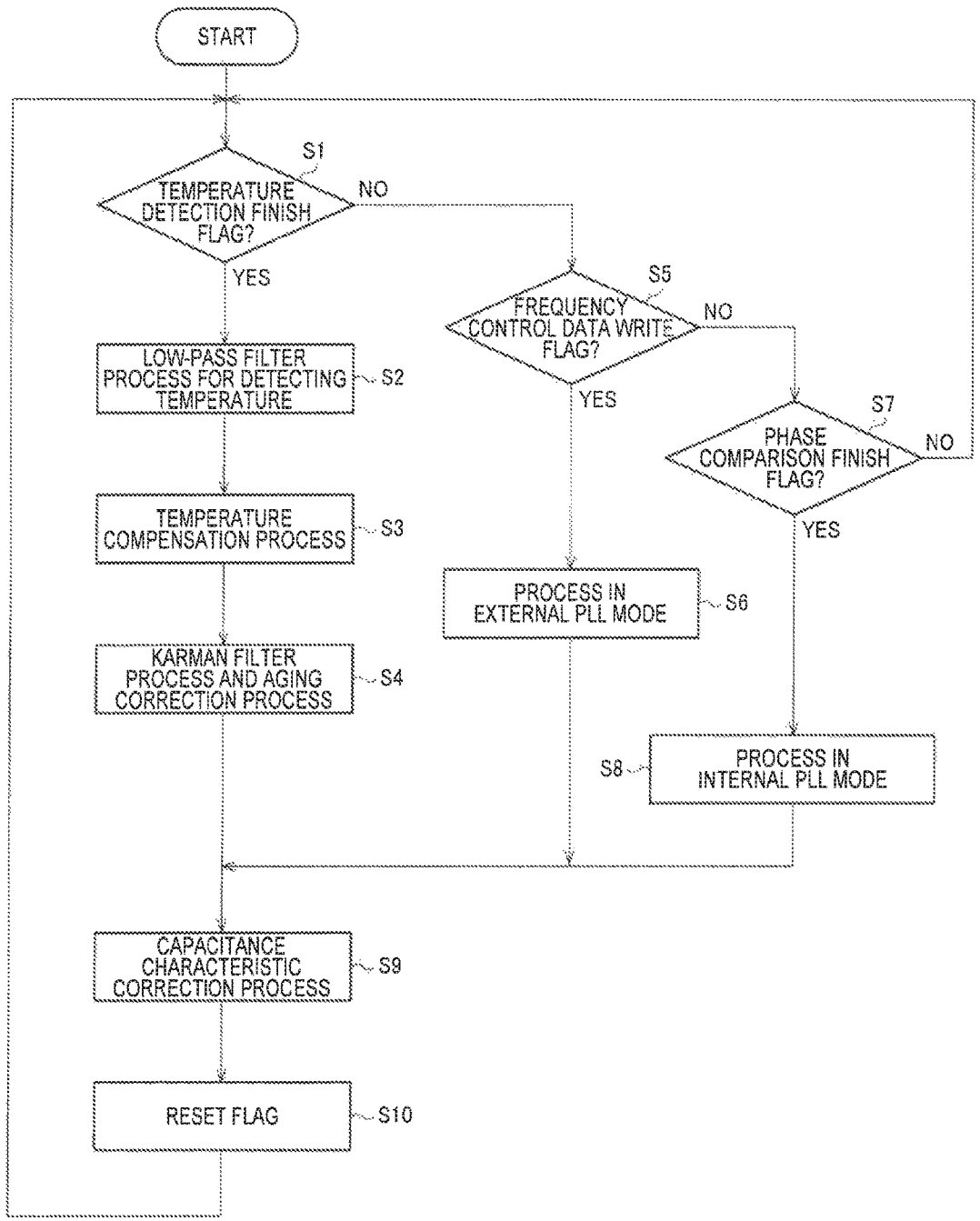
FIG. 9 is a flowchart illustrating a process performed by the processor.

FIG. 9 is a flowchart illustrating a process performed by the processor 50.

If the process is started, the processor 50 determines whether or not a temperature detection finish flag is active (step S1). The temperature detection finish flag becomes active in a case where the A/D converter 20 outputs (updates) the temperature detection data DTD.

In a case where the temperature detection finish flag is active, the processor 50 performs a low-pass filter process for detecting a temperature (step S2). In other words, the centigrade degree converter 81 converts the temperature detection data DTD into centigrade, and the low-pass filter 82 performs a low-pass filter process on the temperature detection data DTD'. Next, the temperature compensator 58 performs a temperature compensation process on the basis of the temperature detection data DTD" having undergone the low-pass filter process, and generates the temperature compensation data TCODE (step S3). Next, the Karman filter 54 performs a Karman filter process on the basis of the frequency control data DFCE or QDF. The aging corrector 56 performs an aging correction process during hold-over (step S4). Next, the flow proceeds to step S9.

In a case where the temperature detection finish flag is inactive in step S1, it is determined whether or not a frequency control data write flag is active (step S5). The frequency control data write flag becomes active in a case where the frequency control data DFCE is input (written to the register circuit 32, for example) via the digital interface 30 from the external frequency control data generator.

In a case where the frequency control data write flag is active, the processor 50 performs a process in the external PLL mode (step S6). Specifically, the adder 84 and the selector 87 perform this process. Next, the flow proceeds to step S9.

In a case where the frequency control data write flag is inactive, it is determined whether or not a phase comparison finish flag is active (step S7). The phase comparison finish flag becomes active in a case where the phase comparator 40 outputs (updates) the phase error data PED. Specifically, the phase comparison finish flag becomes active every n cycles of the reference signal RFCK. Alternatively, the phase comparison finish flag may also become active when the phase comparator 40 outputs the phase error data PED for each cycle of the reference signal RFCK. In this case, for example, the same phase error data PED is output for n times, and a value of the phase error data PED changes every n cycles of the reference signal RFCK.

In a case where the phase comparison finish flag is active, the processor 50 performs a process in the internal PLL mode (step S8). Specifically, the internal PLL processor 83, the adder 85, and the selector 87 perform this process. Next, the flow proceeds to step S9.

In a case where the phase comparison finish flag is inactive, the flow returns to step S1, and the loop is repeated until any one of the temperature detection finish flag, the frequency control data write flag, and the phase comparison finish flag becomes active so that flag waiting is performed.

In step S9, the capacitance characteristic corrector 89 performs a capacitance characteristic correction process on the frequency control data DFCQ' which is a process result in any one of steps S4, S6 and S8, and outputs the frequency control data DFCQ to the oscillation signal generation circuit 140 (or the dithering processor 160) (step S9). Next, the processor 50 resets the flags (step S10). Specifically, among the temperature detection finish flag, the frequency control data write flag, and the phase comparison finish flag, a flag which is active is reset to be inactive. Next, the flow returns to step S1, and flag waiting is performed.

Figure 10:
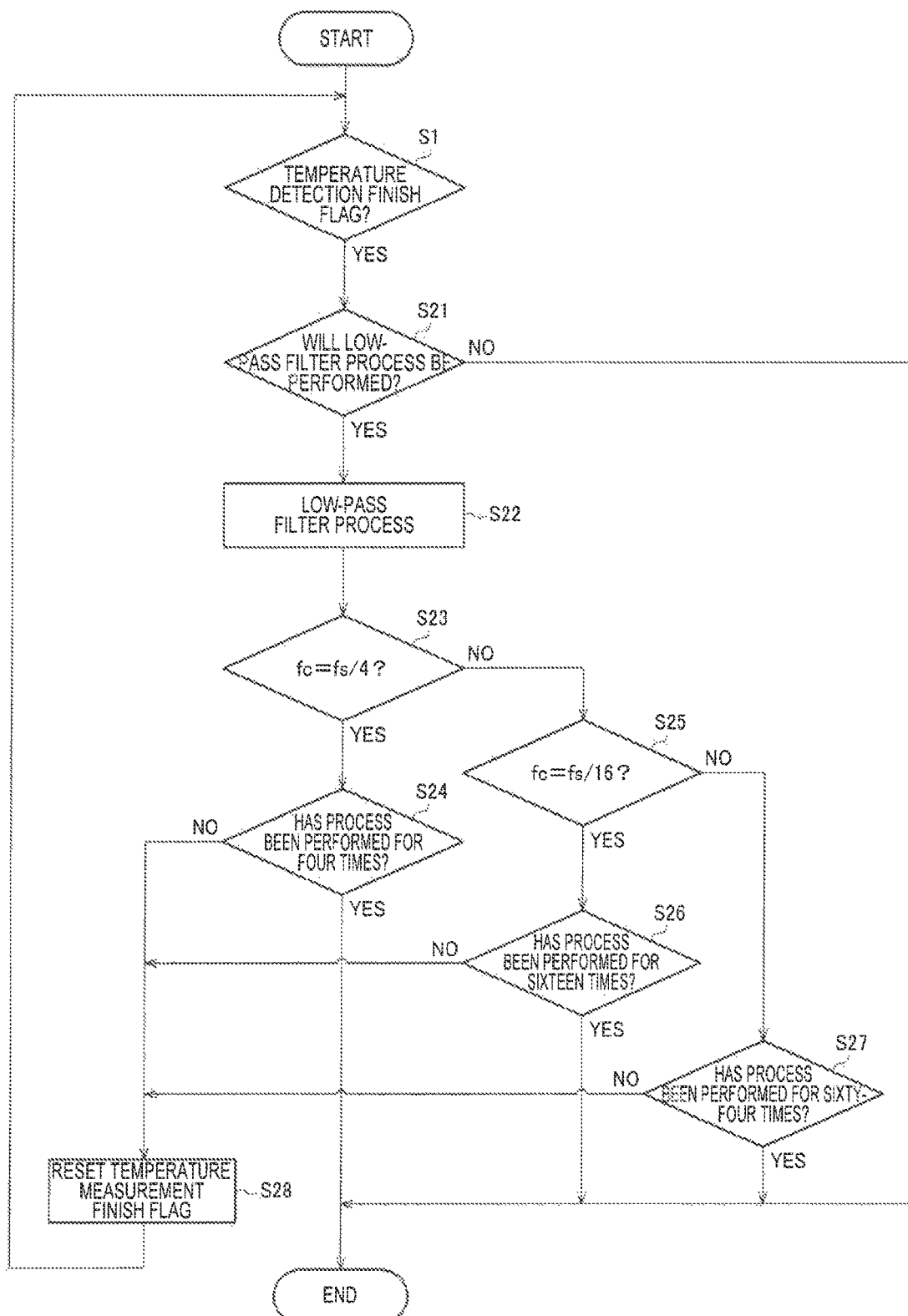
FIG. 10 is a flowchart illustrating details of a low-pass filter process for detecting temperature.

FIG. 10 is a flowchart illustrating details of the low-pass filter process (step S2) for detecting a temperature.

The processor 50 determines whether or not the low-pass filter process is set to be enabled (step S21). In a case where the low-pass filter process is set to be disabled, the process is finished without performing the low-pass filter process. A centigrade conversion process is performed, for example, before step S21.

In a case where the low-pass filter process is set to be enabled, the low-pass filter 82 performs the low-pass filter process on the temperature detection data DTD' (step S22). Next, it is determined whether or not the cutoff frequency fc in the low-pass filter process is set to fs/4 (step S23). Here, fs indicates an operation frequency of the low-pass filter process. In other words, fs indicates a sampling frequency for the temperature detection data DTD (a frequency at which the A/D converter 20 outputs the temperature detection data DTD).

In a case where the cutoff frequency fc is set to fs/4, the processor 50 determines whether or not the low-pass filter process is performed for four times (whether or not the low-pass filter process is performed on the temperature detection data DTD which is input for four times) (step S24). The process is finished in a case where the low-pass filter process is performed for four times. In a case where the low-pass filter process is not performed for four times, a temperature measurement finish flag is reset to be inactive (step S28), and the flow returns to step S1.

In a case where the cutoff frequency fc is not set to be fs/4, it is determined whether or not the cutoff frequency fc in the low-pass filter process is set to fs/16 (step S25).

In a case where the cutoff frequency fc is set to fs/16, the processor 50 determines whether or not the low-pass filter process is performed for sixteen times (whether or not the low-pass filter process is performed on the temperature detection data DTD which is input for sixteen times) (step S26). The process is finished in a case where the low-pass filter process is performed for sixteen times. In a case where the low-pass filter process is not performed for sixteen times, the temperature measurement finish flag is reset to be inactive (step S28), and the flow returns to step S1.

In a case where the cutoff frequency fc is not set to be fs/16, the cutoff frequency fc is set to fs/64, and thus the processor 50 determines whether or not the low-pass filter process is performed for sixty-four times (whether or not the low-pass filter process is performed on the temperature detection data DTD which is input for sixty-four times) (step S27). The process is finished in a case where the low-pass filter process is performed for sixty-four times. In a case where the low-pass filter process is not performed for sixty-four times, the temperature measurement finish flag is reset to be inactive (step S28), and the flow returns to step S1.

Figure 11:
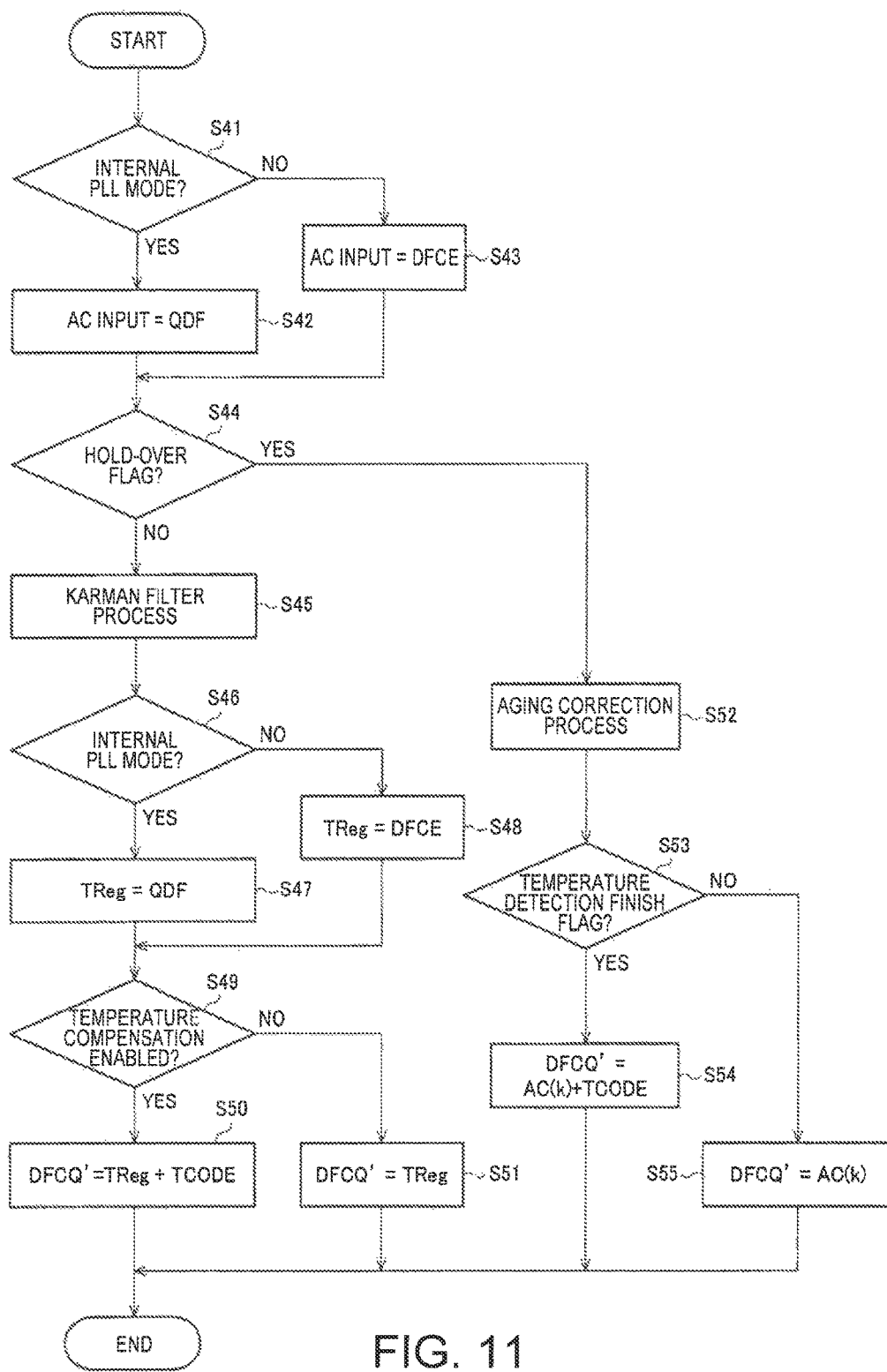
FIG. 11 is a flowchart illustrating details of a Karman filter process and an aging correction process.

FIG. 11 is a flowchart illustrating details of the Karman filter process and the aging correction process (step S4).

The processor 50 determines whether or not the internal PLL mode is set (step S41). In a case where the internal PLL mode is set, the frequency control data QDF is stored in an input register (AC input) for the Karman filter process (step S42). In a case where the external PLL mode is set (the internal PLL mode is not set), the frequency control data DFCE is stored in the input register for the Karman filter process (step S43).

Next, the processor 50 determines whether or not a hold-over flag (a signal HOLDOVER in FIG. 16) is active (step S44). The hold-over flag becomes active in a case where the hold-over processor 52 determines a hold-over state.

In a case where the hold-over flag is inactive, the Karman filter 54 performs the Karman filter process on an input which is selected in step S42 or S43 (step S45). Next, the processor 50 determines whether or not the internal PLL mode is set (step S46). In a case where the internal PLL mode is set, the frequency control data QDF is stored in a register for a variable TReg (step S47). In a case where the external PLL mode is set, the frequency control data DFCE is stored in the register for the variable TReg (step S48).

Next, the processor 50 determines whether or not the temperature compensation process is set to be enabled (step S49). In a case where the temperature compensation process is set to be enabled, a value obtained by adding the variable TReg to the temperature compensation data TCODE is stored in a register for the frequency control data DFCQ' (step S50). In a case where the temperature compensation process is set to be disabled, the variable TReg is stored in the register for the frequency control data DFCQ' (step S51). The processes in steps S49 to S51 correspond to processes performed by the adders 84 and 85 and the selector 87.

In a case where the hold-over flag is active in step S44, the aging corrector 56 performs the aging correction process (step S52). Next, the processor 50 determines whether or not the temperature detection finish flag is active (step S53). In a case where the temperature detection finish flag is active, a value obtained by adding the frequency control data AC(k) to the temperature compensation data TCODE is stored in the register for the frequency control data DFCQ' (step S54). In a case where the temperature detection finish flag is inactive, the frequency control data AC(k) is stored in the register for the frequency control data DFCQ' (step S55). The processes in steps S53 to S55 correspond to processes performed by the adder 86 and the selector 87.

Figure 12:
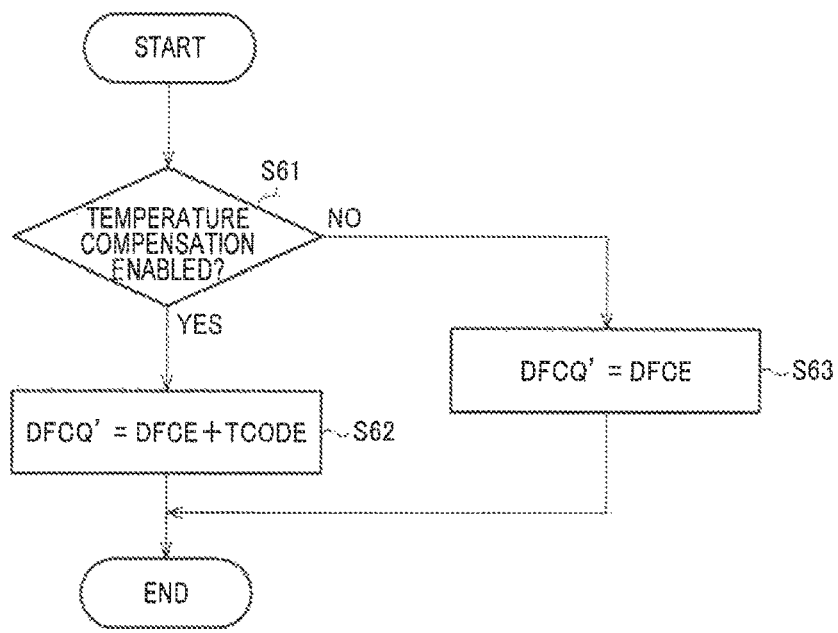
FIG. 12 is a flowchart illustrating details of a process in an external PLL mode.

FIG. 12 is a flowchart illustrating details of the process (step S6) in the external PLL mode.

The processor 50 determines whether or not the temperature compensation process is set to be enabled (step S61). In a case where the temperature compensation process is set to be enabled, a value obtained by adding the frequency control data DFCE to the temperature compensation data TCODE is stored in the register for the frequency control data DFCQ' (step S62). In a case where the temperature compensation process is set to be disabled, the frequency control data DFCE is stored in the register for the frequency control data DFCQ' (step S63). The processes in steps S61 to S63 correspond to processes performed by the adder 84 and the selector 87.

Figure 13:
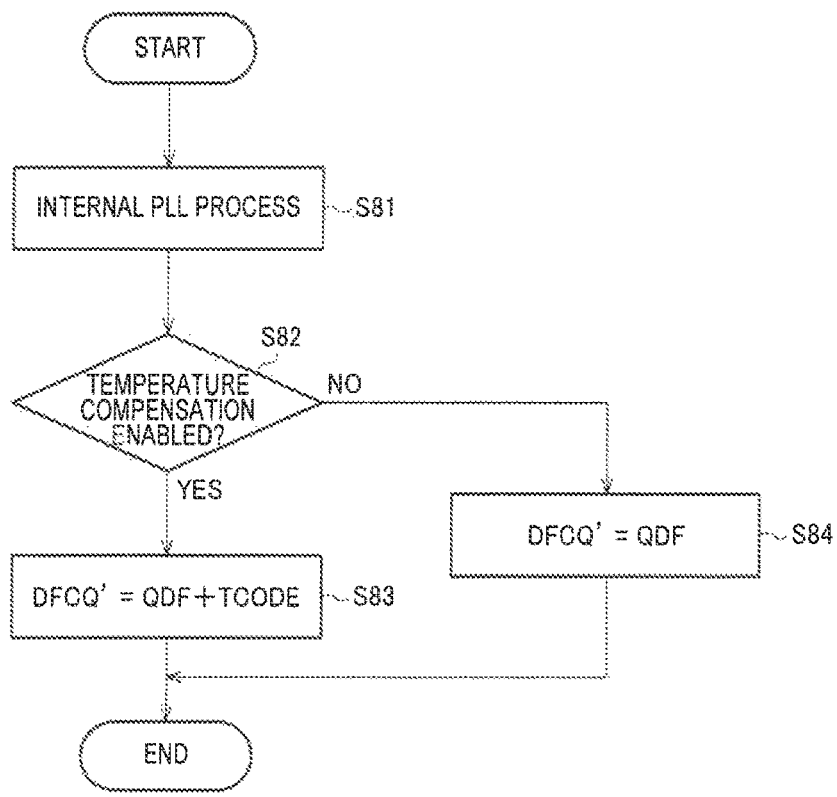
FIG. 13 is a flowchart illustrating details of a process in an internal PLL mode.

FIG. 13 is a flowchart illustrating details of the process (step S8) in the internal PLL mode.

The internal PLL processor 83 performs an internal PLL process on the phase error data PED so as to generate the frequency control data QDF (step S81). Next, the processor 50 determines whether or not the temperature compensation process is set to be enabled (step S82). In a case where the temperature compensation process is set to be enabled, a value obtained by adding the frequency control data QDF to the temperature compensation data TCODE is stored in the register for the frequency control data DFCQ' (step S83). In a case where the temperature compensation process is set to be disabled, the frequency control data QDF is stored in the register for the frequency control data DFCQ' (step S84). The processes in S82 to S84 correspond to processes performed by the adder 85 and the selector 87.

8. Third Detailed Configuration of Processor

Figure 14:
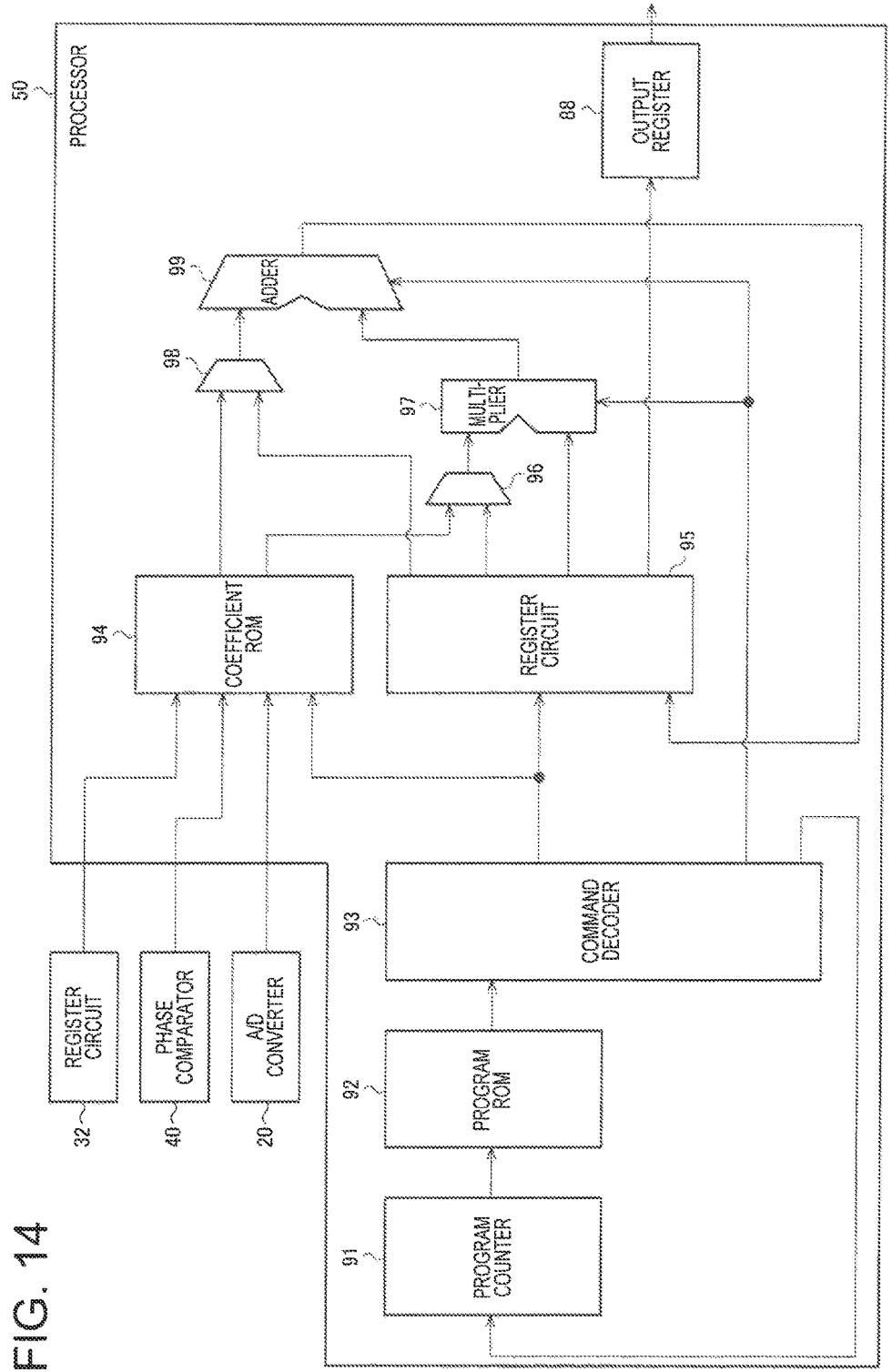
FIG. 14 is a diagram illustrating a third detailed configuration example of the processor.

FIG. 14 is a diagram illustrating a third detailed configuration example of the processor 50. FIG. 14 illustrates a configuration example of a case where the processor 50 is formed of a DSP. In other words, the DSP executes commands described in a program, and thus the process described with reference to the functional block diagram of FIG. 8 or the processes described with reference to the flowcharts of FIGS. 9 to 13 are realized.

The processor 50 includes a program counter 91, a program ROM 92, a command decoder 93, a coefficient ROM 94, a register circuit 95, a selector 96, a multiplier 97, a selector 98, an adder 99, and an output register 88.

The program ROM 92 is a read only memory (ROM) storing a program. Program data may be formed by using logic circuits (a combined circuit or the like). For example, the program is formed of a row number, a command corresponding to the row number, and an operand operated according to the command.

The program counter 91 is a counter which outputs a row number of the program. The program. ROM 92 outputs a row number, a command, and an operand, designated by a count value in the program counter 91.

The command decoder 93 analyzes the command and the operand, and outputs control signals for the multiplier 97 or the adder 99 performing a process corresponding to the command and the operand. Specifically, the command decoder 93 outputs a multiplier input address for indicating data which is to be input to the multiplier 97, a multiplier input data sign indicating a sign of data which is to be input to the multiplier 97, an adder input address for indicating data which is to be input to the adder 99, an adder input data sign indicating a sign of data which is to be input to the adder 99, and a write address indicating a register address in which data output from the adder 99 is stored.

The coefficient ROM 94 includes a ROM and a selector. Various some coefficients used for calculation performed by the processor 50 are stored in the ROM. Remaining some coefficients are stored in the storage 34, and are read from the storage 34 so as to be stored in the register circuit 32. Coefficients from the ROM and the register circuit 32 and data which is input to the processor 50 are input to the selector. The input data includes, for example, the frequency control data DFCE from the register circuit 32, the phase error data PED from the phase comparator 40, and the temperature detection data DTD from the A/D converter 20. The selector selects a coefficient or input data corresponding to the multiplier input address from the command decoder 93, and outputs the selected coefficient or input data to the selector 96. The selector selects a coefficient or input data corresponding to the adder input address from the command decoder 93, and outputs the selected coefficient or input data to the selector 98.

The register circuit 95 includes a register and a selector. The register temporarily stores data (including intermediately generated data) generated through calculation. For example, the register stores the variable TReg, the temperature compensation data TCODE, and the frequency control data QDF, DFCQ' and AC(k). The selector selects data corresponding to the multiplier input address from the command decoder 93, and outputs the selected data to the selector 96 or the multiplier 97. The selector selects data corresponding to the adder input address from the command decoder 93, and outputs the selected data to the selector 98.

The selector 96 selects one of the coefficient or the input data from the coefficient ROM and the data from the register circuit 95, and outputs a selected result to the multiplier 97. The selector 98 selects one of the coefficient or the input data from the coefficient ROM and the data from the register circuit 95, and outputs a selected result to the adder 99.

The multiplier 97 multiplies an output from the selector 96 by the data from the register circuit 95, and outputs a result thereof to the adder 99. The adder 99 adds an output from the selector 98 to an output from the multiplier 97, and outputs a result thereof to the register circuit 95. The register circuit 95 stores the output from the multiplier 97 in a register of the register circuit 95 corresponding to the write address from the command decoder 93.

The output register 88 stores data output from the processor 50, and outputs the data to an external device of the processor 50. For example, the output register 88 stores the frequency control data DFCQ which is output to the oscillation signal generation circuit 140 (or the dithering processor 160).

9. Aging Correction Using Karman Filter Process

In the present embodiment, an aging correction method using a Karman filter process is employed. Hereinafter, this method will be described.

Figure 15:
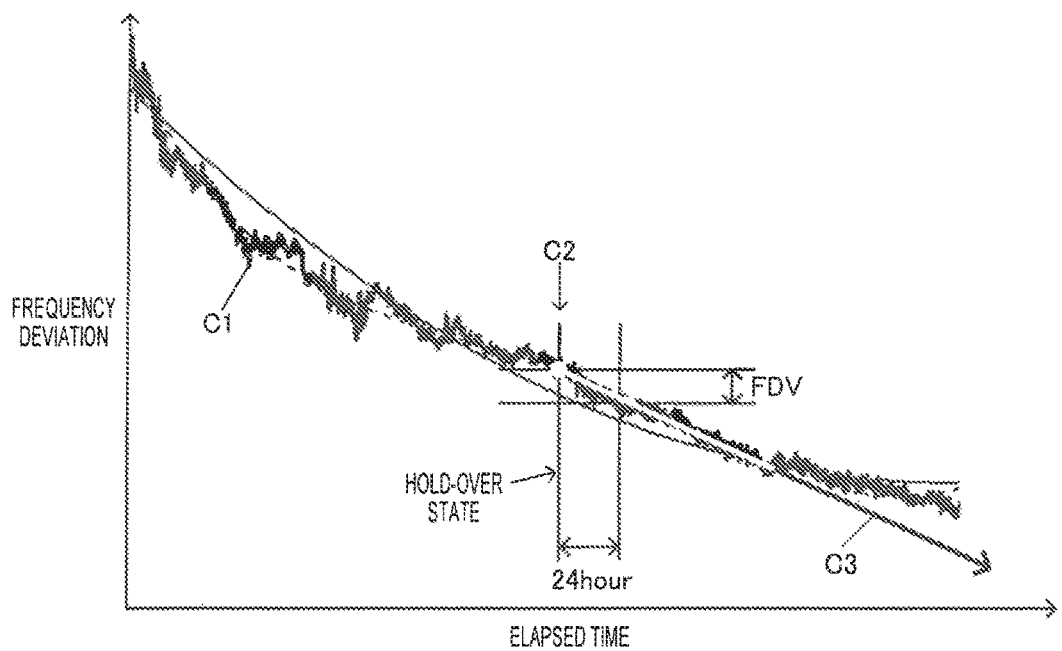
FIG. 15 is a diagram illustrating an example of a measurement result of a variation in an oscillation frequency due to aging.

FIG. 15 is a diagram illustrating examples of results of measuring an oscillation frequency change due to aging. A transverse axis expresses the elapsed time (aging time), and a longitudinal axis expresses the frequency deviation ($\Delta f/f_0$) of an oscillation frequency. As indicated by C1 in FIG. 15, there are large variations caused by system noise or observation noise in measured values which are observed values. These variations also include a variation caused by the environmental temperature. In a situation in which there are large variations in the observed values, in the present embodiment, state estimation using a Karman filter process (for example, a linear Karman filter process) is performed in order to obtain an accurate true value.

Discrete time state equations of a time-series state space model are given by a state equation and an observation equation of the following (11) and (12).

$$x(k+1)=A \cdot x(k)+v(k) \tag{11}$$

$$y(k)=x(k)+w(k) \tag{12}$$

Here, x(k) indicates a state at a time point k, and y(k) indicates an observed value (frequency control data). In addition, v(k) indicates system noise, w(k) indicates observation noise, and A is a system matrix. In a case where x(k) indicates an oscillation frequency (frequency control data), A corresponds to, for example, an aging rate (aging coefficient). The aging rate indicates a change rate of the oscillation frequency with respect to the elapsed time.

For example, it is assumed that a hold-over state occurs at a timing indicated by C2 in FIG. 15. In this case, aging correction is performed on the basis of a true value x (k) at the time point C2 at which the reference signal RFCK is stopped, and an aging rate (A) corresponding to an inclination indicated by C3 in FIG. 15. Specifically, as compensation (correction) for reducing a frequency change at the aging rate indicated by C3, for example, aging correction of sequentially changing the true value x(k) of the oscillation frequency (frequency control data) at the time point C2 with a correction value for canceling the frequency change is performed.

Details of the Karman filter process in the present embodiment will be described. In the Karman filter process of the present embodiment, the process is performed according to the following Equations (13) to (18), and thus a true value is estimated. In the present specification, the hat symbol "^" indicating an estimated value is arranged with two letters as appropriate.

$$\hat{x}^-(k) = \hat{x}(k-1) + D(k-1) \tag{13}$$

$$P^-(k) = P(k-1) + v(k) \tag{14}$$

$$G(k) = \frac{P^-(k)}{P^-(k) + w(k)} \tag{15}$$

$$\hat{x}(k) = \hat{x}^-(k) + G(k) \cdot (y(k) - \hat{x}^-(k)) \tag{16}$$

$$P(k) = (1 - G(k)) \cdot P^-(k) \tag{17}$$

$$D(k) = D(k-1) + E \cdot (y(k) - \hat{x}^-(k)) \tag{18}$$

$\hat{x}(k)$: post-estimated value
$\hat{x}^-(k)$: pre-estimated value
$P(k)$: post-covariance
$P^-(k)$: pre-covariance
$G(k)$: Karman gain In the Karman filter process, the Karman gain G(k) is obtained according to the above Equation (15) during observation update (observation process). The post-estimated value x˘(k) is updated according to the above Equation (16)

on the basis of the observed value y(k). The post-covariance P(k) of errors is updated according to the above Equation (17).

In time update (prediction process), as shown in the above Equation (13), the pre-estimated value $x^-(k)$ at the next time step k is predicted by adding the post-estimated value $x^{\wedge}(k-1)$ and the correction value D(k−1) at the time step k−1 together. As shown in the above Equation (14), the pre-covariance $P^-(k)$ at the next time step k is predicted on the basis of the post-covariance P(k−1) at the time step k−1 and the system noise v(k). As shown in the above Equation (18), the correction value D(k) at the next time step k is obtained by adding the correction value D(k−1) at the time step k−1 to a value obtained by multiplying an observation residual $y(k)-x^-(k)$ by a constant E. In the present embodiment, as shown in the above Equation (13), the post-estimated value $x^{\wedge}(k-1)$ is added to the correction value D(k−1) instead of multiplying the post-estimated value $x^{\wedge}(k-1)$ by the system matrix A. In other words, the correction value D(k) corresponds to a predicted value for an aging rate.

Figure 16:
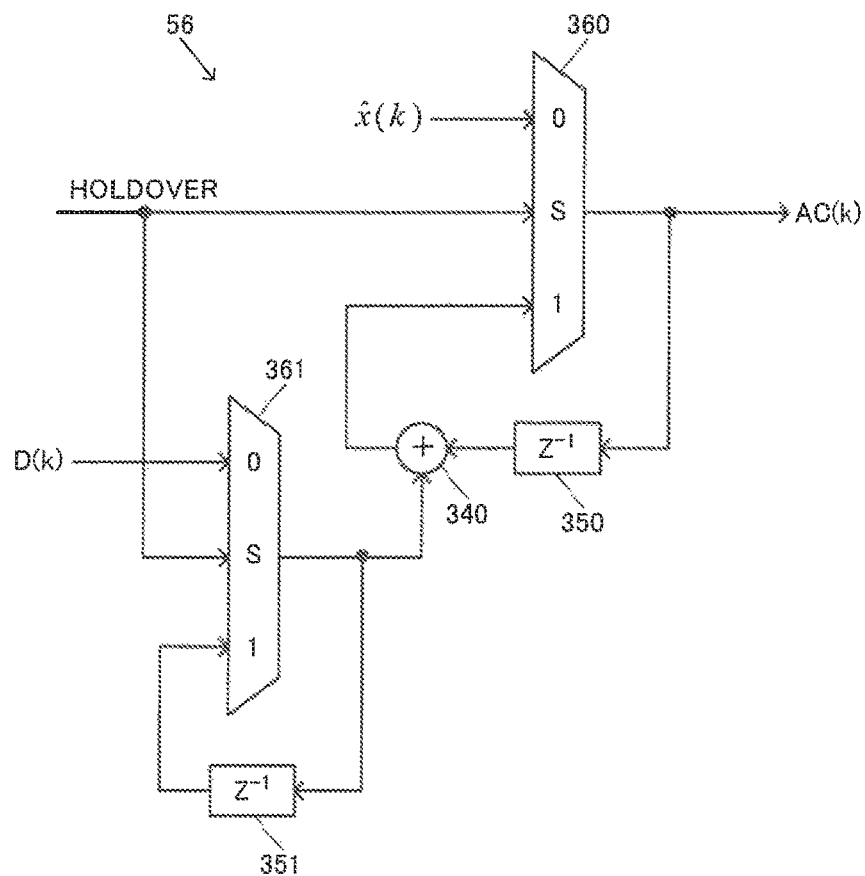
FIG. 16 is a diagram illustrating a detailed configuration example of an aging corrector.

FIG. 16 illustrates a detailed configuration example of the aging corrector 56.

The signal HOLDOVER is a signal whose logic level is "1" (active; hereinafter, simply referred to as "1") in a hold-over period in which a hold-over state is detected. Specifically, a signal PLOCK which is a lock detection signal in the external PLL mode or a signal DTL which is a lock detection signal in the internal PLL mode is set as a signal PLLLOCK. In a case where the signal PLLLOCK has a logic level of "0" (inactive; hereinafter, simply referred to as "0") and a signal SYNCCLK has "0", the signal HOLDOVER has "1", and, in a case where the signal PLLLOCK has "1" or the signal SYNCCLK has "1", the signal HOLDOVER has "0".

In a normal operation period, since the signal HOLDOVER has "0", selectors 360 and 361 select terminal "0" sides. Consequently, in the normal operation period, the post-estimated value $x^{\wedge}(k)$ and the correction value D(k) calculated by the Karman filter 54 are respectively held in registers 350 and 351.

If a hold-over state is detected, and the signal HOLDOVER has "1", the selectors 360 and 361 select terminal "1" sides. Consequently, the selector 361 continuously outputs the correction value D(k) held in the register 351 at the hold-over detection timing during a hold-over period.

An adder 340 performs a process of sequentially adding the correction value D(k) (correction value) which is held in the register 351 and is output from the selector 361, to the post-estimated value $x^{\wedge}(k)$ held in the register 350 at the hold-over detection timing, for each time step.

Consequently, aging correction as expressed by the following Equation (19) is realized.

$$AC(k+1)=AC(k)+D(k) \quad (19)$$

10. Oscillation Circuit

Figure 17:
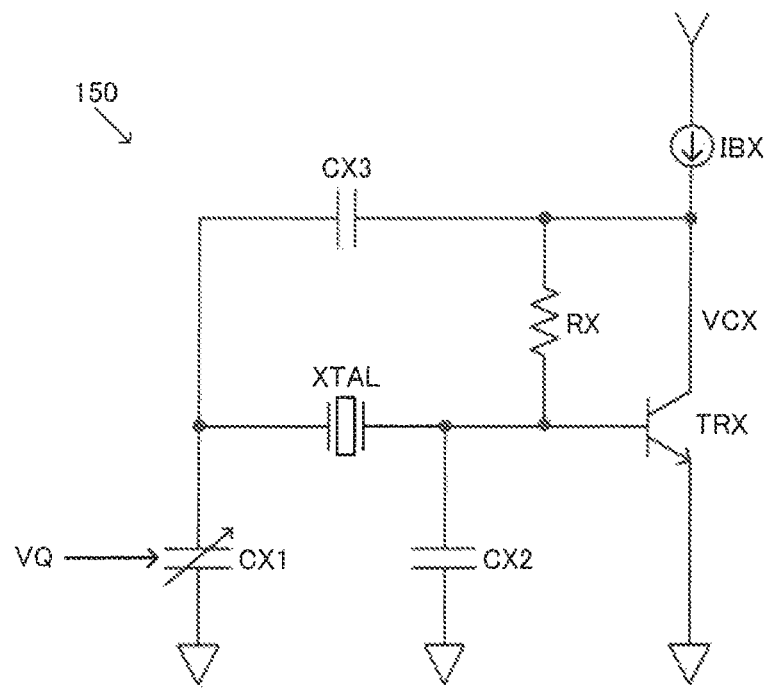
FIG. 17 is a diagram illustrating a configuration example of an oscillation circuit.

FIG. 17 illustrates a configuration example of the oscillation circuit 150. The oscillation circuit 150 includes a current source IBX, a bipolar transistor TRX, a resistor RX, a variable capacitance capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitance capacitor CX1 whose capacitance is variable is connected to one end of a resonator XTAL. Specifically, one end of the variable capacitance capacitor CX1 is connected to one end of the resonator XTAL via a first resonator terminal (resonator pad) of the circuit device 500. One end of the capacitor CX2 is connected to the other end of the resonator XTAL. Specifically, one end of the capacitor CX2 is connected to the other end of the resonator XTAL via a second resonator terminal (resonator pad) of the circuit device 500. One end of the capacitor CX3 is connected to one end of the resonator XTAL, and the other end thereof is connected to the collector of the bipolar transistor TRX.

A base-emitter current caused by oscillation of the resonator XTAL flows through the bipolar transistor TRX. If the base-emitter current increases, a current between the collector and the emitter of the bipolar transistor TRX increases, and thus a bias current which branches to the resistor RX from the current source IBX is reduced so that a collector voltage VCX is lowered. On the other hand, if a current between the base and the emitter of the bipolar transistor TRX is reduced, a collector-emitter current is reduced, and thus a bias current which branches to the resistor RX from the current source IBX increases so that the collector voltage VCX is heightened. The collector voltage VCX is fed back to the resonator XTAL via the capacitor CX3.

An oscillation frequency of the resonator XTAL has temperature characteristics, and the temperature characteristics are compensated by the output voltage VQ (frequency control voltage) from the D/A converter 80. In other words, the output voltage VQ is input to the variable capacitance capacitor CX1, and thus a capacitance value of the variable capacitance capacitor CX1 is controlled by the output voltage VQ. If the capacitance value of the variable capacitance capacitor CX1 changes, a resonance frequency of an oscillation loop changes, and thus a variation in an oscillation frequency due to the temperature characteristics of the resonator XTAL is compensated for. The variable capacitance capacitor CX1 is implemented by, for example, a variable capacitance diode (varactor).

11. Modification Examples

Figure 18:
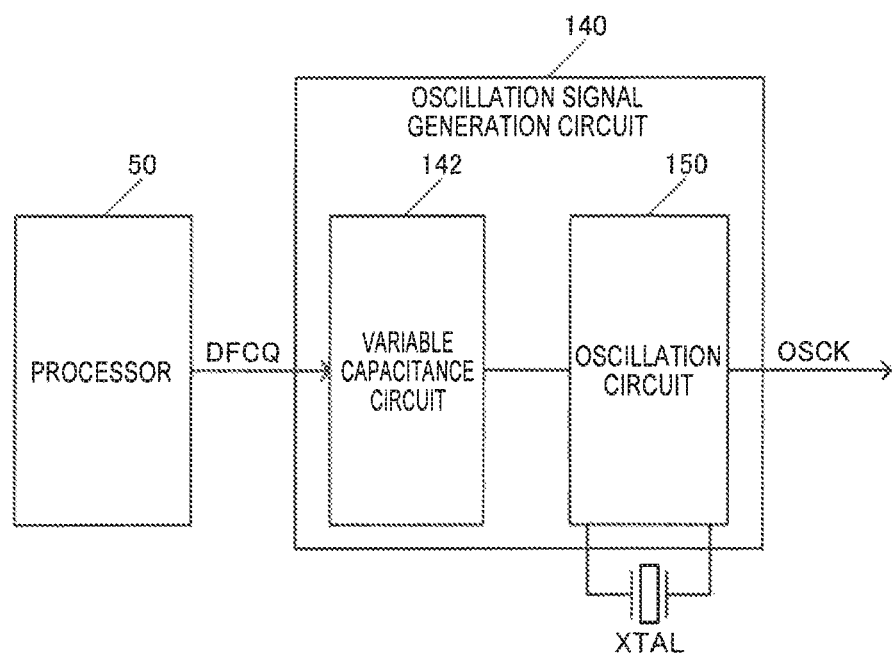
FIG. 18 is a diagram illustrating a configuration example of a circuit device according to a modification example of the embodiment.

Next, various modification examples of the present embodiment will be described. FIG. 18 illustrates a configuration example of a circuit device according to a modification example of the present embodiment.

In FIG. 18, the D/A converter 80 is not provided in the oscillation signal generation circuit 140 unlike in FIG. 7. An oscillation frequency of the oscillation signal OSCK generated by the oscillation signal generation circuit 140 is directly controlled on the basis of the frequency control data DFCQ from the processor 50. In other words, an oscillation frequency of the oscillation signal OSCK is controlled without using the D/A converter.

For example, in FIG. 18, the oscillation signal generation circuit 140 has a variable capacitance circuit 142 and an oscillation circuit 150. The variable capacitance circuit 142 is provided instead of the variable capacitance capacitor CX1 illustrated in FIG. 17, and one end of the variable capacitance circuit 142 is connected to one end of the resonator XTAL.

A capacitance value of the variable capacitance circuit 142 is controlled on the basis of the frequency control data DFCQ from the processor 50. For example, the variable capacitance circuit 142 is provided with a plurality of capacitors (capacitor array), and a plurality of switch elements (switch array) each of which allows turning-on and turning-off to be controlled on the basis of the frequency control data DFCQ. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value of the resonator XTAL changes. Therefore, a capacitance value of the variable capacitance circuit 142 can be directly controlled by the frequency control data DFCQ, and thus an oscillation frequency of the oscillation signal OSCK can be controlled.

Figure 19:
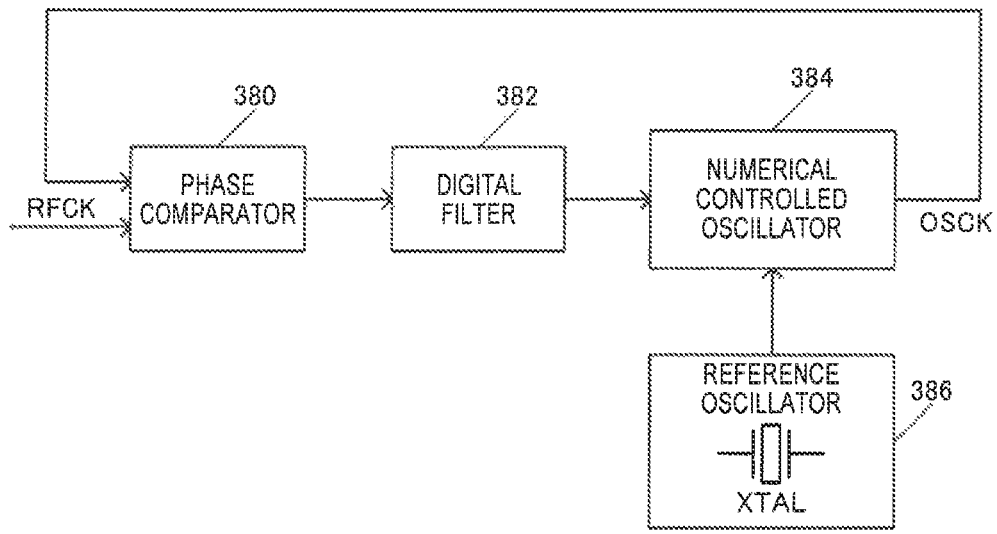
FIG. 19 illustrates a circuit configuration example in a case of a direct digital synthesizer method.

In a case where a PLL circuit is formed by using the circuit device of the present embodiment, the PLL circuit may be formed according to a direct digital synthesizer method. FIG. 19 illustrates a circuit configuration example in a case of the direct digital synthesizer method.

A phase comparator 380 (comparison calculator) performs comparison calculation between the reference signal RFCK and the oscillation signal OSCK (an input signal based on the oscillation signal). A digital filter 382 performs a smoothing process on phase errors. A configuration and an operation of the phase comparator 380 are the same as those of the internal phase comparator 40 illustrated in FIG. 1, and may include the counter 42 or the like. The digital filter 382 corresponds to the phase error converter 51, the loop filter 55, and the frequency control data converter 57 illustrated in FIG. 4. A numerical controlled oscillator 384 is a circuit which digitally synthesizes any frequency or waveform by using a reference oscillation signal from a reference oscillator 386 having the resonator XTAL. In other words, instead of controlling an oscillation frequency on the basis of a control voltage from a D/A converter, such as a VCO, the oscillation signal OSCK having any oscillation frequency is generated through a digital calculation process by using digital frequency control data and the reference oscillator 386 (resonator XTAL).

12. Oscillator, Electronic Apparatus, and Vehicle

Figure 20:
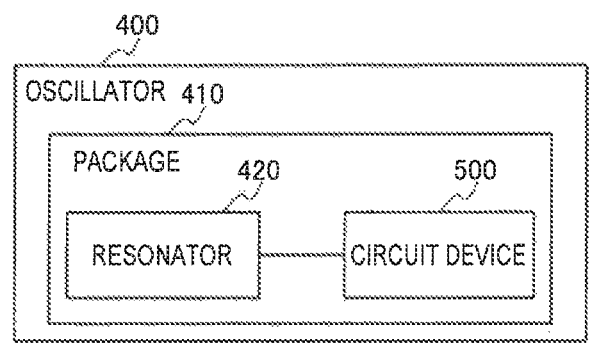
FIG. 20 is a diagram illustrating a configuration example of an oscillator including the circuit device according to the embodiment.

FIG. 20 illustrates a configuration example of an oscillator 400 provided with the circuit device 500 of the present embodiment. As illustrated in FIG. 20, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (integrated circuit device; IC) via an internal wiring of the package 410.

Figure 21:
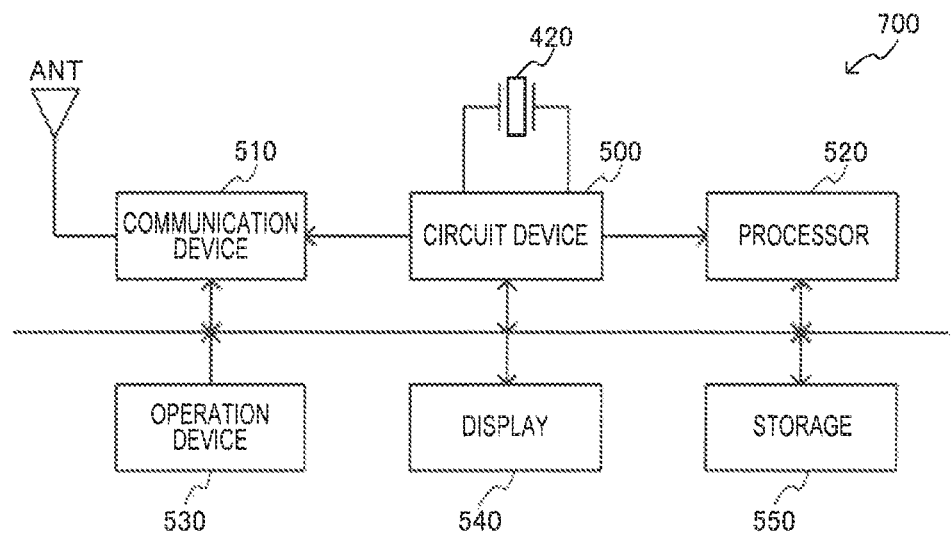
FIG. 21 is a diagram illustrating a configuration example of an electronic apparatus including the circuit device according to the embodiment.

FIG. 21 illustrates a configuration example of an electronic apparatus 700 including the circuit device 500 of the present embodiment. The electronic apparatus 700 includes the circuit device 500 of the present embodiment, the resonator 420 such as a quartz crystal resonator, an antenna ANT, a communication device 510, a processor 520, and the like. The electronic apparatus 700 may include an operation device 530, a display 540, and a storage 550. The oscillator 400 is formed of the resonator 420 and the circuit device 500. A configuration of the electronic apparatus is not limited to the configuration illustrated in FIG. 21, and may be variously modified by omitting some constituent elements or adding other constituent elements thereto.

As the electronic apparatus 700 illustrated in FIG. 21, there may be various apparatuses, for example, a network related apparatus such as a base station or a router, a highly accurate measurement apparatus, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, and a video apparatus such as a digital camera or a video camera.

The communication device 510 (wireless circuit) performs a process of receiving data from an external apparatus or transmitting data to the external apparatus, via the antenna ANT. The processor 520 performs a process of controlling the electronic apparatus 700, or various digital processes on data which is transmitted and received via the communication device 510. The function of the processor 520 may be realized by, for example, a processor such as a microcomputer.

The operation device 530 is used for a user to perform an input operation, and may be implemented by, for example, an operation button or a touch panel display. The display 540 displays various pieces of information, and may be implemented by, for example, a liquid crystal display or an organic EL display. In a case where a touch panel display is used as the operation device 530, the touch panel display also functions as the operation device 530 and the display 540. The storage 550 stores data, and a function thereof may be realized by a semiconductor memory such as a RAM or a ROM, or a hard disk drive (HDD).

Figure 22:
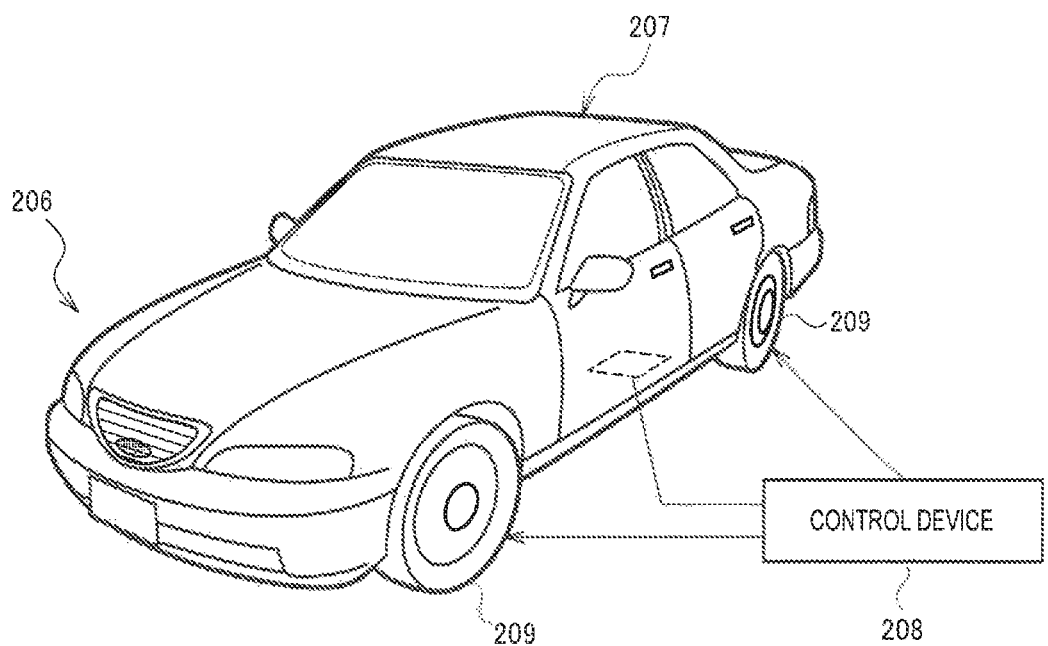
FIG. 22 is a diagram illustrating an example of a vehicle including the circuit device according to the embodiment.

FIG. 22 illustrates an example of a vehicle including the circuit device 500 of the present embodiment. The circuit device 500 (the oscillator 400 including the circuit device 500) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 22 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Figure 23:
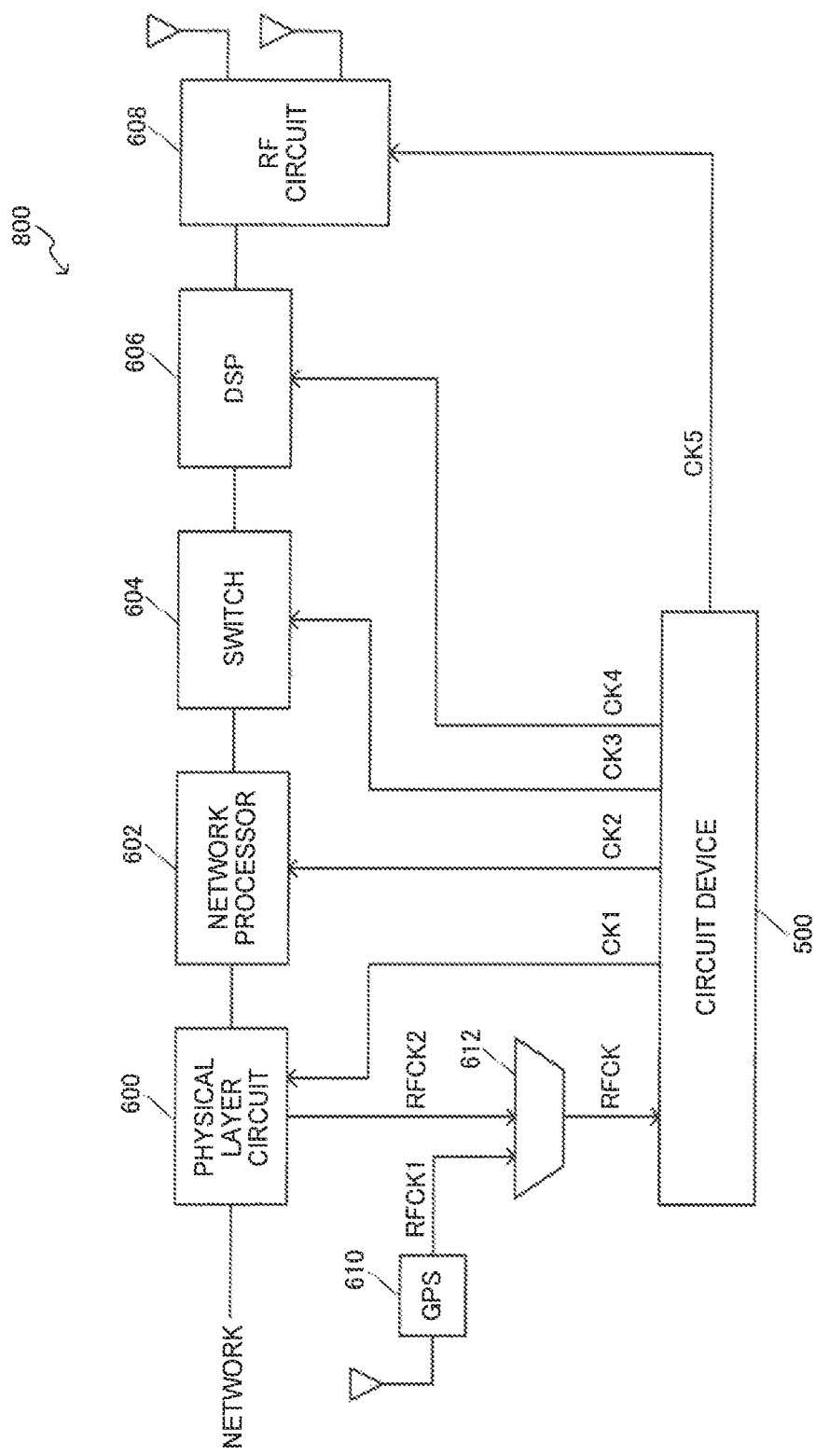
FIG. 23 is a diagram illustrating a configuration example of a base station which is one of the electronic apparatuses.

FIG. 23 illustrates a configuration example of a base station 800 (base station apparatus) which is one of the electronic apparatuses. A physical layer circuit 600 performs a process on a physical layer in a communication process using a network. A network processor 602 performs a process on a higher-order layer (a link layer or the like) than the physical layer. A switch 604 performs various switching processes in the communication process. A DSP 606 performs various digital signal processes which are necessary in the communication process. An RF circuit 608 includes a reception circuit formed of a low noise amplifier (LNA), a transmission circuit formed of a power amplifier, a D/A converter, an A/D converter, and the like.

A selector 612 outputs either a reference signal RFCK1 from a GPS 610 or a reference signal RFCK2 (a clock signal from the network) from the physical layer circuit 600, to the circuit device 500 of the present embodiment as the reference signal RFCK. The circuit device 500 performs a process of synchronizing an oscillation signal (an input signal based on the oscillation signal) with the reference signal RFCK. Various clock signals CK1, CK2, CK3, CK4 and CK5 having different frequencies are generated, and are supplied to the physical layer circuit 600, the network processor 602, the switch 604, and the DSP 606, and the RF circuit 608.

According to the circuit device 500 of the present embodiment, in a base station as illustrated in FIG. 23, an oscillation signal can be synchronized with the reference signal RFCK, and the clock signals CK1 to CK5 having the high frequency stability, generated on the basis of the oscillation signal, can be supplied to the respective circuits of the base station.

Although the present embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the invention. In addition, configurations, operations, and the like of the phase comparator, the processor, the oscillation signal generation circuit, the circuit device, the oscillator, the electronic apparatus, and the vehicle are also not limited to the above description of the present embodiment, and may have various modifications.

What is claimed is:

1. A circuit device comprising:
    a comparator that performs a comparison between an input signal based on an oscillation signal and a reference signal, the comparator including a counter that performs a count operation by using the input signal, and performs the comparison by comparing a count value in the counter in n (where n is an integer of 2 or more) cycles of the reference signal with an expected value of the count value in integers;
    a processor that performs a signal process on frequency control data based on a result of the comparison; and
    an oscillation signal generation circuit that generates the oscillation signal having an oscillation frequency which is set on the basis of the frequency control data having undergone the signal process.

2. The circuit device according to claim 1,
    wherein n is set to k1 (where k1 is an integer of 2 or more) in at least a state in which the oscillation frequency is set based on a frequency of the reference signal.

3. The circuit device according to claim 2,
    wherein n is set to k2 (where k2 is an integer of 1 or more and below k1) at the time of starting to set the oscillation frequency based on the frequency of the reference signal.

4. An oscillator comprising:
    the circuit device according to claim 3; and
    a resonator that is used to generate the oscillation signal.

5. The circuit device according to claim 2,
    wherein n is set to k3 (where k3 is an integer of 1 or more and below k1) in a test mode.

6. The circuit device according to claim 2,
    wherein, in a case where n is set to k4 (where k4 is an integer of 1 or more and below k1), the comparator sets n to k5 (where k5 is an integer of 2 or more and k1 or less) more than k4 if a difference between the count value and the expected value is equal to or less than a predetermined value.

7. An oscillator comprising:
    the circuit device according to claim 2; and
    a resonator that is used to generate the oscillation signal.

8. The circuit device according to claim 1,
    wherein n is set to be variable.

9. The circuit device according to claim 8,
    wherein, in a case where n is set to k4 (where k4 is an integer of 1 or more), the comparator sets n to k5 (where k5 is an integer of 2 or more) more than k4 if a difference between the count value and the expected value is equal to or less than a predetermined value.

10. The circuit device according to claim 8,
    wherein a gain adjustment coefficient for a result of the comparison is set depending on a value of n.

11. The circuit device according to claim 1,
    wherein the comparator shifts bits of frequency setting data so as to obtain the expected value, and compares the obtained expected value with the count value.

12. The circuit device according to claim 11,
    wherein the counter counts down by using the input signal in n cycles of the reference signal with the expected value as an initial value, and outputs the count value obtained through countdown as a result of the comparison.

13. The circuit device according to claim 1,
    wherein the processor performs the signal process including at least one of a temperature compensation process, an aging correction process, and a process of correcting capacitance characteristics of a variable capacitance capacitor connected to a resonator used to generate the oscillation signal, and a digital filter process on error data which is the result of the comparison.

14. The circuit device according to claim 1, further comprising:
    a digital interface;
    wherein the oscillation signal generation circuit:
        generates the oscillation signal by using the frequency control data based on the result of the comparison in a first mode; and
        generates the oscillation signal by using the frequency control data which is generated based on externally generated frequency control data which is input via the digital interface in a second mode.

15. An oscillator comprising:
    the circuit device according to claim 1; and
    a resonator that is used to generate the oscillation signal.

16. An electronic apparatus comprising the circuit device according to claim 1.

17. A vehicle comprising the circuit device according to claim 1.

18. A negative feedback control device comprising:
    a comparator that performs a comparison between an input signal based on an oscillation signal and a reference signal to generate error data, the comparator including a counter that performs a count operation by using the input signal, and performs the comparison by comparing a count value in the counter in n (where n is an integer of 2 or more) cycles of the reference signal with an expected value of the count value in integers;
a processor that performs negative feedback control on the error data to generate frequency control data; and
an oscillation signal generation circuit that generates the oscillation signal having an oscillation frequency which is set on the basis of the frequency control data.

* * * * *